(12) United States Patent
Mehrad et al.

(10) Patent No.: US 8,574,980 B2
(45) Date of Patent: Nov. 5, 2013

(54) METHOD OF FORMING FULLY SILICIDED NMOS AND PMOS SEMICONDUCTOR DEVICES HAVING INDEPENDENT POLYSILICON GATE THICKNESSES, AND RELATED DEVICE

(75) Inventors: Freidoon Mehrad, Plano, TX (US); Shaofeng Yu, Plano, TX (US); Steven A. Vitale, Murphy, TX (US); Craig H. Huffman, Krugerville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 296 days.

(21) Appl. No.: 11/741,551

(22) Filed: Apr. 27, 2007

(65) Prior Publication Data

US 2009/0057776 A1 Mar. 5, 2009

(51) Int. Cl.
*H01L 21/8238* (2006.01)
(52) U.S. Cl.
USPC .................................. 438/233; 257/E21.438
(58) Field of Classification Search
USPC .......... 438/199, 233, 630; 257/369, 412, 413, 257/E21.622, E21.636, E21.439, E29.161
See application file for complete search history.

(56) References Cited

U.S. PATENT DOCUMENTS

| | | | | |
|---|---|---|---|---|
| 4,376,672 A | * | 3/1983 | Wang et al. | 438/713 |
| 4,877,755 A | * | 10/1989 | Rodder | 438/586 |
| 4,933,297 A | * | 6/1990 | Lu | 438/620 |
| 5,280,190 A | * | 1/1994 | Lu | 257/587 |
| 5,352,631 A | * | 10/1994 | Sitaram et al. | 438/300 |
| 5,411,907 A | * | 5/1995 | Yoo et al. | 438/231 |
| 5,981,325 A | * | 11/1999 | Hung | 438/224 |
| 6,451,693 B1 | * | 9/2002 | Woo et al. | 438/682 |
| 7,407,828 B2 | * | 8/2008 | Lee | 438/57 |
| 2006/0105557 A1 | * | 5/2006 | Klee et al. | 438/592 |
| 2006/0263961 A1 | * | 11/2006 | Kittl et al. | 438/199 |
| 2007/0228458 A1 | * | 10/2007 | Henson et al. | 257/327 |
| 2007/0281429 A1 | * | 12/2007 | Sato | 438/294 |

OTHER PUBLICATIONS

Lauwers et al. "CMOS Integration of Dual Work Function Phase Controlled no FUSI with Simultaneous Silicidation of NMOS (NiSi) and PMOS (Ni-rich silicide) Gates on HfSiON", 2005, IEEE 0-7803-9269-8/05.*

* cited by examiner

*Primary Examiner* — Leonard Chang
(74) *Attorney, Agent, or Firm* — Rose Alyssa Keagy; W. James Brady; Frederick J. Telecky, Jr.

(57) ABSTRACT

A method of forming fully silicided NMOS and PMOS semiconductor devices having independent polysilicon gate thicknesses, and related device. At least some of the illustrative embodiments are methods comprising forming an N-type gate over a semiconductor substrate (the N-type gate having a first thickness), forming a P-type gate over the semiconductor substrate (the P-type gate having a second thickness different than the first thickness), and performing a simultaneous silicidation of the N-type gate and the P-type gate.

18 Claims, 15 Drawing Sheets

METHOD OF FORMING FULLY SILICIDED NMOS AND PMOS SEMICONDUCTOR DEVICES HAVING INDEPENDENT POLYSILICON GATE THICKNESSES, AND RELATED DEVICE

BACKGROUND

Electronic devices are continually getting smaller, faster, and using less power, while simultaneously being able to support and perform a greater number of increasingly complex and sophisticated functions. One reason for these trends is an ever increasing demand for small, portable and multifunctional electronic devices. For example, cellular phones, personal computing devices, and personal audio devices (e.g., MP3 players) are in great demand in the consumer market. Such electronic devices rely on a limited power source (e.g., batteries) while providing ever-increasing processing capabilities and storage capacity.

Accordingly, there is a continuing trend in the semiconductor industry to manufacture low-cost, high-performance, and low-power integrated circuits (ICs). These goals have been achieved in great part by scaling down the dimensions of semiconductor ICs and thus increasing device and circuit densities. Achieving higher densities calls for smaller feature sizes, smaller separations between features and layers, and more precise feature shapes. The scaling down of IC dimensions can facilitate faster circuit performance (e.g., faster switching speeds) and can lead to higher effective yield in IC fabrication processes by providing (i.e., "packing") more circuits on a semiconductor die and/or more die on a semiconductor wafer.

A fundamental building block of semiconductor ICs is the metal-oxide semiconductor (MOS) transistor. FIG. 1 illustrates a cross-section of a MOS transistor 100. The transistor 100 is fabricated on a semiconductor substrate 110 and comprises a gate stack 120. The gate stack 120 comprises a gate dielectric 130 (e.g., silicon dioxide) and a gate electrode 140 (e.g., polysilicon) on the gate dielectric 130. The transistor 100 also comprises a source region 150 and a drain region 160 each formed within the semiconductor substrate 110. A channel 170 is defined between the source and drain regions 150, 160, under the gate dielectric 130, and within the semiconductor substrate 110. The channel 170 has an associated channel length "L" and an associated channel width "W". When a bias voltage greater than a threshold voltage (Vt) (i.e., turn-on voltage) for the transistor 100 is applied to the gate electrode 140 along with a concurrently applied bias voltage between the source and drain regions 150, 160, an electric current (e.g., a transistor drive current) flows between the source and drain regions 150, 160 through the channel 170. The amount of drive current developed for a given bias voltage (e.g., applied to the gate electrode 140 or between the source and drain regions 150, 160) is a function of, among others, the width-to-length ratio (W/L) of the channel 170.

MOS transistors have become cheaper, faster, and less power-hungry with each new technology generation as the physical dimensions and applied voltages have been scaled down. To date, most transistor scaling has been achieved by thinning the gate dielectric 130 or reducing the channel length "L". However, as transistor scaling moves into the nanometer-scale regime, scaling the gate dielectric 130 thickness or the channel length "L" is not sufficient as new phenomenon appear (e.g., leakage current flowing through the gate dielectric 130, polysilicon gate electrode depletion effects ("poly-depletion"), and contact resistance effects), which reduce the transistor drive current. The poly-depletion effect is characterized by a polysilicon gate electrode 140 that is no longer fully conductive and contributes an additional capacitance (in series) between the gate electrode 140 and the silicon substrate 110, resulting in reduced transistor drive current. New gate dielectrics having a high dielectric constant ("high-K" gate dielectrics) have been introduced in an effort to improve transistor drive current without increasing the leakage current through the gate dielectric 130. However, high-K gate dielectrics face reliability and compatibility issues with polysilicon gate electrodes such as poor work function control, which results in, for example, transistors having an unsuitable threshold voltage (Vt). For other gate dielectric materials such as silicon dioxide, polysilicon gate electrodes become problematic with scaling due to the poly-depletion effect and contact resistance problems.

SUMMARY

The problems noted above are solved in large part by a method of forming fully silicided NMOS and PMOS semiconductor devices having independent polysilicon gate thicknesses, and related device. At least some of the illustrative embodiments are methods comprising forming an N-type gate over a semiconductor substrate (the N-type gate having a first thickness), forming a P-type gate over the semiconductor substrate (the P-type gate having a second thickness substantially unequal to the first thickness), and performing a simultaneous silicidation of the N-type gate and the P-type gate.

Other illustrative embodiments are semiconductor devices comprising a substrate having an N-type active area, an isolation structure abutting the N-type active area, a P-type active area abutting the isolation structure, an N-type gate on the N-type active area (the N-type gate having a first thickness), and a P-type gate on the P-type active area (the P-type gate having a second thickness different than the first thickness).

BRIEF DESCRIPTION OF THE DRAWINGS

For a more detailed description of the various embodiments, reference will now be made to the accompanying drawings, wherein.

NOTATION AND NOMENCLATURE

Figure 1:
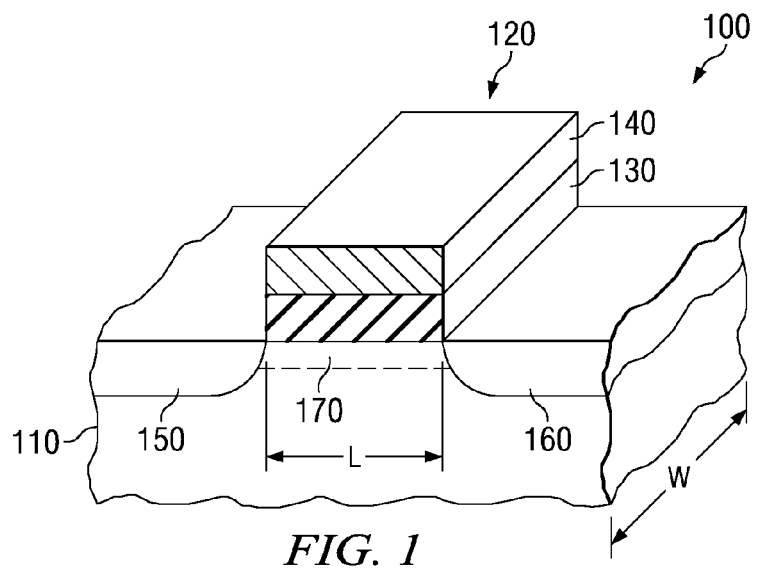
FIG. 1 shows a perspective view of a MOS transistor.

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

A "blocking" layer means a layer that substantially blocks, for example, blocks a dopant species delivered by way of ion implantation. The term "active region" means a region where a semiconductor device is formed within and/or on a semiconductor substrate, and where the active region does not comprise isolation structures, such as shallow trench isolation (STI) structures or field oxide (FOX) regions.

Unless otherwise stated, when a layer is said to be "deposited over the substrate" or "formed over the substrate", it means that the layer is deposited or formed over any topography that already exists on the substrate.

The term "thermal budget" is used to define an amount of thermal energy transferred to a semiconductor wafer (e.g., during a high-temperature process) and is given as a product of temperature (e.g., in degrees Kelvin) and time (e.g., in seconds). Low thermal budget processes are preferred, for example, to prevent dopant redistribution or electromigration.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one skilled in the art will understand that the following description has broad application, and the discussion of any embodiment is meant only to be exemplary of that embodiment, and not intended to intimate that the scope of the disclosure, including the claims, is limited to that embodiment. Also, layers and/or elements depicted herein are illustrated with particular dimensions and/or orientations relative to one another for purposes of simplicity and ease of understanding, and actual dimensions and/or orientations of the layers and/or elements may differ substantially from that illustrated herein.

The subject matter disclosed herein is directed to methods associated with construction of a semiconductor device, such as a metal-oxide semiconductor (MOS) transistor. A semiconductor is a material (e.g., silicon or germanium) having properties somewhere between a conductor and an insulator. By adding impurities (e.g., by a process known as "doping"), a semiconductor can be classified as being electron-rich (N-type, where "N" stands for Negative) or electron-poor (P-type, where "P" stands for Positive). Through a series of semiconductor processing techniques (e.g., deposition, photolithography, etching, ion implantation), semiconductor materials are used to make semiconductor devices (e.g., transistors) which are in turn used to make integrated circuits (ICs). Moreover, N-type MOS transistors (NMOS) and P-type MOS (PMOS) transistors are often used together to form complementary metal-oxide semiconductor (CMOS) ICs.

Metallic gate electrodes in semiconductor CMOS ICs overcome electrostatic and transport issues (e.g., poly-depletion, threshold voltage control, and contact resistance) associated with polysilicon gate electrodes. In particular, embodiments disclosed herein relate to integrating a metallic gate electrode into a CMOS process flow by way of a fully silicided (FUSI) process flow. Silicidation of a polysilicon gate electrode involves depositing a layer of metal (e.g., Nickel) over the polysilicon gate and annealing to induce a reaction between the metal and the polysilicon gate. During the anneal, a deposited layer of metal diffuses into the polysilicon gate and reacts to form a metal silicide (e.g., nickel silicide). In a FUSI process flow, the deposited layer of metal diffuses into, and reacts with, the entire polysilicon gate to form a "fully" silicided metal gate, as opposed to diffusing into, and reacting with, less than the entire polysilicon gate to form a partially silicided metal gate, where an unreacted polysilicon layer remains within the gate electrode. In other FUSI process flows, silicon from the polysilicon gate diffuses into the deposited metal layer as opposed to the metal diffusing into the polysilicon gate; however, the result is the same in that a fully silicided metal gate is formed. In some embodiments, a layer of metal is reacted with the source and drain regions of a transistor to form fully silicided source and drain regions, which lessens the contact resistance of the source and drain regions.

Prior to the FUSI flow, the polysilicon gate electrode of a MOS transistor may be doped with a dopant species (e.g., boron for PMOS transistors, and phosphorous or arsenic for NMOS transistors). In some embodiments, the PMOS and/or the NMOS transistor polysilicon gate electrode remains undoped. During FUSI processing, the silicidation rate of the NMOS transistor and PMOS transistor polysilicon gate electrodes is dependent on the dopant species and the dopant concentration within the polysilicon gate. For example, a phosphorous or arsenic doped NMOS transistor polysilicon gate silicides faster than an undoped or boron doped PMOS transistor polysilicon gate. Thus, in a CMOS process flow having NMOS and PMOS polysilicon gates of substantially equal thickness, a simultaneous silicidation of the NMOS and PMOS polysilicon gates will result in, for example, a fully silicided NMOS polysilicon gate and a partially silicided PMOS polysilicon gate. It is desirable to fully silicide both NMOS and PMOS polysilicon gates in a single FUSI process flow (e.g., by providing NMOS and PMOS polysilicon gates of different thickness, where for example, the NMOS polysilicon gate thickness is greater than the PMOS polysilicon gate thickness). Thus, the embodiments described herein provide a method of integrating a FUSI process flow into a CMOS flow where the NMOS and PMOS polysilicon gates have different thicknesses, and where the full silicidation of the NMOS and PMOS polysilicon gates is performed simultaneously in a single FUSI process flow.

Figure 2:
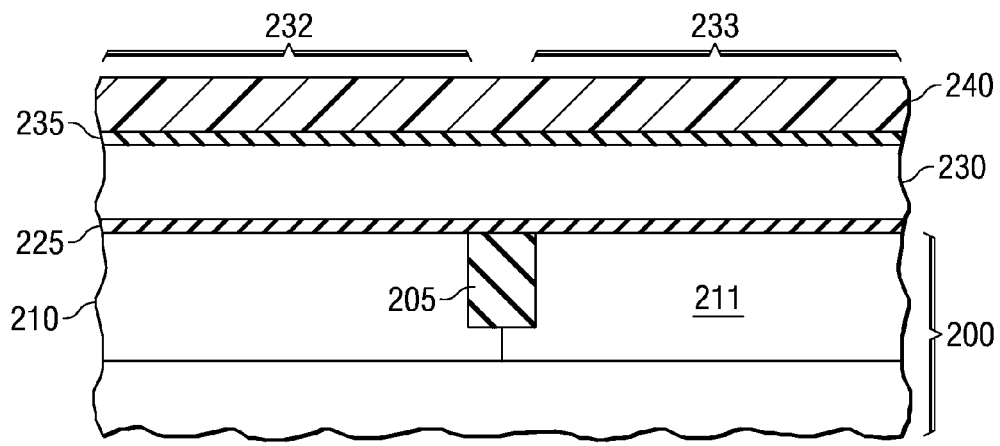
FIG. 2 shows a cross sectional view illustrating the formation of a MOS transistor after formation of a first polysilicon layer.

Referring to FIG. 2, an isolation structure 205 is formed within a substrate 200 in order to define an active area 232, and active area 233, and to electrically isolate neighboring devices (e.g., transistors) from one another. In some embodiments, the substrate 200 comprises, for example, a P-type single crystal silicon substrate that may be formed, for example, by epitaxial growth. In other embodiments, the substrate 200 comprises for example, a silicon germanium (SiGe) substrate or a silicon-on-insulator (SOI) substrate. The isolation structure 205 can be formed, for example, by a shallow trench isolation (STI) process. A well 210 and a well 211 are then formed within the substrate 200, for example, by performing an ion implantation into the substrate 200 followed by a high-temperature anneal. Each of the wells 210, 211 are doped with N-type dopants (e.g., phosphorous or arsenic) or P-type dopants (e.g., boron) depending on the type of transistor (NMOS or PMOS) to be formed within each of the active areas 232, 233. For purposes of this disclosure, the well 210 is doped with a P-type dopant (thus, an NMOS transistor is formed within the active area 232, and the active area 232 may be equivalently referred to as an NMOS active area 232), and the well 211 is doped with an N-type dopant (thus, a PMOS transistor is formed within the active area 233, and the active area 233 may be equivalently referred to as a PMOS active area 233). A dielectric layer 225 is then formed over the substrate 200. The dielectric layer 225 comprises a non-conductive material (e.g., a silicon oxide (i.e., $SiO_2$), a silicon oxynitride, or a high dielectric constant ("high-K") material such as a hafnium-based metal-oxide). Depending on the material used for the dielectric layer 225, the dielectric layer 225 can be formed by a variety of techniques (e.g., thermal oxidation, thermal oxidation followed by a thermal nitridation, atomic layer deposition (ALD), or chemical vapor deposition (CVD)). A polysilicon layer 230 is then formed over the dielectric layer 225. The polysilicon layer 230 is formed, for example, by using a low-pressure chemical vapor deposition (LPCVD) process. In some embodiments, the polysilicon layer 230 has a thickness of about 600 Angstroms. The polysilicon layer 230 is used as the polysilicon gate for the PMOS transistor (formed in the PMOS active area 233) that is silicided during the FUSI process flow (discussed below). Thus, the polysilicon gate for the PMOS transistor has a thickness equal to thickness of the polysilicon layer 230. In some embodiments, the polysilicon gate for the PMOS transistor has a thickness of about 600 Angstroms. The polysilicon layer 230 is also used as a first portion of the polysilicon gate for the NMOS transistor (formed in the NMOS active area 232).

After formation of the polysilicon layer 230, ion implantations (e.g., for each the NMOS active area 232 and the PMOS active area 233) are optionally performed for the purpose of doping the polysilicon layer 230. Depending on the type of transistor being formed (NMOS or PMOS), the ion implantation can implant either N-type or P-type dopants. During the FUSI process flow, the fully silicided gate electrode retains the doping introduced during such an ion implantation so that the resulting fully silicided gate electrode has a work function and threshold voltage (Vt) determined, at least in part, by the ion implantation. In some embodiments, the dopant species of the ion implantation is selected in order to tune the work function of the gate electrode. In some embodiments, a blocking layer (not shown) is deposited over the polysilicon layer 230 (e.g., over the PMOS active area 233) to block subsequent ion implantations (e.g., ion implantations used to form lightly-doped source/drain regions, or to form source/drain regions) from the polysilicon layer 230, and thus allows for separate and independent doping of a transistor gate electrode (e.g., which is formed, at least in part, from the polysilicon layer 230) and transistor source/drain regions. An oxide layer 235 is then formed over the polysilicon layer 230. The oxide layer 235 is used as an etch stop layer, and like the dielectric layer 225, the oxide layer 235 can be formed by a variety of techniques (e.g., thermal oxidation, thermal oxidation followed by a thermal nitridation, atomic layer deposition (ALD), or chemical vapor deposition (CVD)). In some embodiments, the oxide layer 235 has a thickness of about 20-25 Angstroms.

A light sensitive layer 240 (e.g., photoresist) is applied on the oxide layer 235 (e.g., by spin-coating) to be used as part of a patterning process (e.g., as part of a lithography process, where lithography broadly refers to processes for transferring one or more patterns between various media). In photolithography, a light sensitive layer (e.g., the light sensitive layer 240) is applied on another layer (e.g., the oxide layer 235). The light sensitive layer is then patterned by exposing it to one or more types of radiation or light which selectively pass through an intervening mask which comprises a pattern defined by various transparent and opaque regions. The light causes exposed or unexposed regions of the light sensitive layer to become more or less soluble, depending on the type of light sensitive layer used. A developer (i.e., an etchant) is then used to remove the more soluble areas, thereby transferring the mask pattern to the light sensitive layer. The patterned light sensitive layer can then serve as a mask for an underlying layer or layers, where portions of the underlying layer or layers not covered, and thus not protected, by the light sensitive layer can be etched, ion implanted, or otherwise processed.

Figure 3:
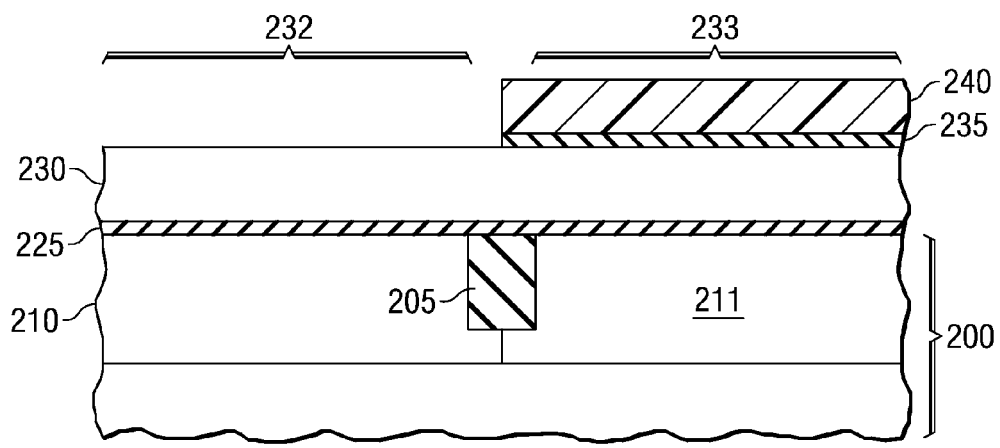
FIG. 3 shows a cross sectional view illustrating the formation of a MOS transistor after patterning of an oxide layer.
Figure 4:
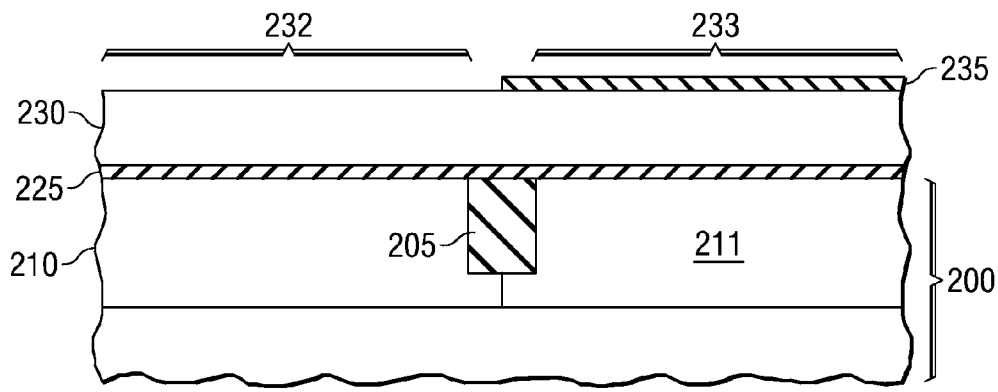
FIG. 4 shows a cross sectional view illustrating the formation of a MOS transistor after removal of a light sensitive layer.

Referring to FIG. 3, the light sensitive layer 240 is patterned using a mask (e.g., an N-type mask), and developed. Processing of the light sensitive layer 240 results in removal of the light sensitive layer 240 over the NMOS active area 232. The oxide layer 235 is then removed over the NMOS active area 232 while the oxide layer 235 over the PMOS active area 233 is protected by the light sensitive layer 240. The oxide layer 235 over the NMOS active area 232 can be removed by a "deglazing" process, where the oxide layer 235 is removed by a wet or dry etch (e.g., using hydroflouric acid or a plasma etch). Thereafter, the light sensitive layer 240 is removed (e.g., by an "ashing" process, where the light sensitive layer 240 is removed by exposure to an oxygen ambient at a high-temperature in the presence of radio frequency (RF) power), as illustrated in FIG. 4.

Figure 5:
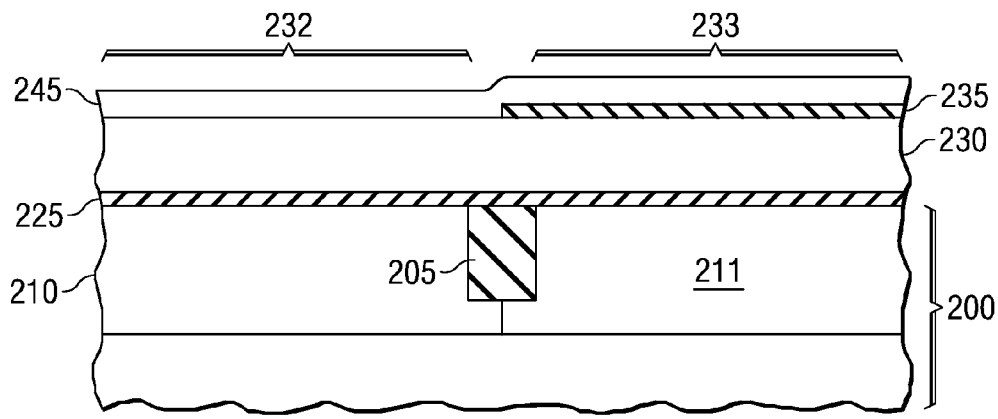
FIG. 5 shows a cross sectional view illustrating the formation of a MOS transistor after formation of a second polysilicon layer.

Referring to FIG. 5, a polysilicon layer 245 is formed over the substrate 200. The polysilicon layer 245 is formed, for example, by using an LPCVD process. In some embodiments, the polysilicon layer 245 has a thickness of about 200 Angstroms. After formation of the polysilicon layer 245, an ion implantation is optionally performed for the purpose of doping the polysilicon layer 245. In other embodiments, after formation of the polysilicon layer 245, an ion implantation is optionally performed to simultaneously dope both the polysilicon layer 230 and the polysilicon layer 245 (e.g., over the NMOS active area 232). The polysilicon layer 245 is used as a second portion of the polysilicon gate for the NMOS transistor. Thus, the thickness of the polysilicon gate for the NMOS transistor is a sum of the thickness of the first portion (i.e., the polysilicon layer 230) and the thickness of the second portion (i.e., the polysilicon layer 245). For example, in some embodiments, the polysilicon gate for the NMOS transistor has a thickness of about 800 Angstroms. Therefore, in some embodiments (e.g., when the thickness of the polysilicon gate for the PMOS transistor is about 600 Angstroms and when the thickness of the polysilicon gate for the NMOS transistor is about 800 Angstroms), the thickness of the polysilicon gate for the NMOS transistor is about 200 Angstroms greater than the thickness of the polysilicon gate for the PMOS transistor, and thus the polysilicon gate for the PMOS transistor is about 75 percent of the thickness of the polysilicon gate for the NMOS transistor. In other embodiments, the simultaneous full silicidation of the NMOS and PMOS polysilicon gates is achieved with other thickness values for each of the NMOS and PMOS polysilicon gates. For example, in some embodiments, the thickness of the polysilicon gate for the NMOS transistor is greater than the thickness of the polysilicon gate for the PMOS transistor by about 20 Angstroms. In some embodiments, a blocking layer (not shown) is deposited over the polysilicon layer 245 (e.g., over the NMOS active area 232) to block subsequent ion implantations (e.g., ion implantations used to form lightly-doped source/drain regions, or to form source/drain regions) from the polysilicon layer 245, and thus allows for separate and independent doping of a transistor gate electrode (e.g., which is formed, at least in part, from the polysilicon layer 245) and transistor source/drain regions.

For purposes of this disclosure, the difference in thicknesses of the NMOS and PMOS polysilicon gates is effectively realized (i.e., a "delta" is created) after removal of the oxide layer 235 and the polysilicon layer 245 from the PMOS active area 233. The oxide layer 235 and the polysilicon layer 245 can be removed from the PMOS active area 233 at various stages throughout the process flow. In some embodiments (e.g., as shown in FIGS. 6-19), the oxide layer 235 and the polysilicon layer 245 are removed from the PMOS active area 233 before patterning and etching to form an NMOS gate stack and a PMOS gate stack. In other embodiments, (e.g., as shown in FIGS. 20-34), the oxide layer 235 and the polysilicon layer 245 are removed from the PMOS active area 233 after patterning and etching to form the NMOS gate stack and the PMOS gate stack. The following discussion begins with a description of the process flow as illustrated in FIGS. 6-19 followed by a description of the process flow as illustrated in FIGS. 20-34.

Figure 6:
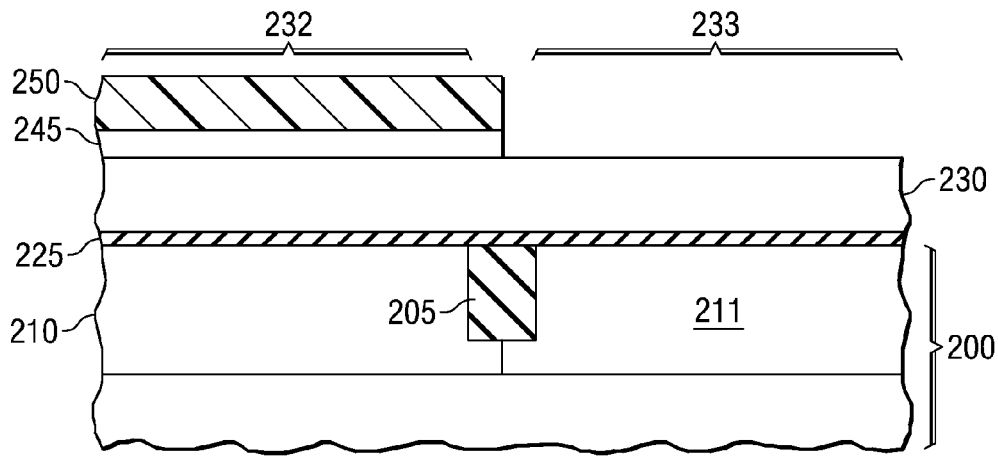
FIG. 6 shows a cross sectional view illustrating the formation of a MOS transistor after removal of a polysilicon layer over a PMOS active area.

Referring to FIG. 6, a light sensitive layer 250 is deposited over the substrate 200, patterned using a mask (e.g., a P-type mask), and developed. Processing of the light sensitive layer 250 results in removal of the light sensitive layer 250 over the PMOS active area 233. Thereafter, the polysilicon layer 245 and the oxide layer 235 are removed over the PMOS active area 233 (as shown in FIG. 6) while the polysilicon layer 245 over the NMOS active area 232 is protected by the light sensitive layer 250. The polysilicon layer 245 over the PMOS active area 233 is removed by an etching process (e.g., a wet or dry etching process), and the oxide layer 235 is removed by deglazing. Thus, the delta in polysilicon gate thicknesses between NMOS and PMOS transistors is created and subsequent simultaneous silicidation of the NMOS polysilicon gate (e.g., doped with an N-type dopant) and the PMOS polysilicon gate (e.g., doped with a P-type dopant, or undoped) will result in fully silicided NMOS and PMOS transistor gate electrodes. The light sensitive layer 250 can then be removed (e.g., by an "ashing" process), and additional processing (e.g., as shown in FIGS. 7-19) is performed.

Figure 7:
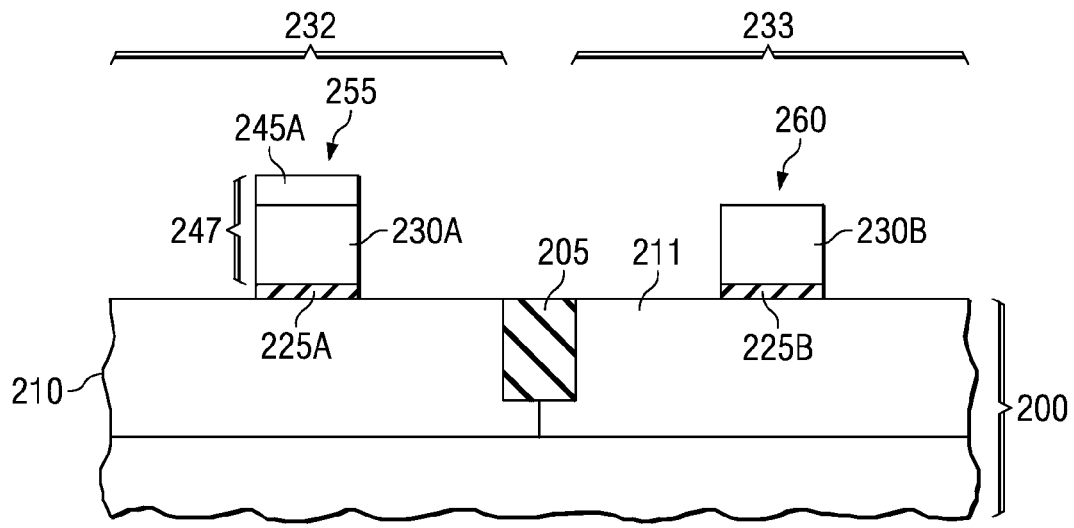
FIG. 7 shows a cross sectional view illustrating the formation of a MOS transistor after formation of an NMOS gate stack and a PMOS gate stack.

As shown in FIG. 7, the dielectric layer 225, the polysilicon layer 230, and the polysilicon layer 245 (FIG. 6) have been patterned and etched to form an NMOS gate stack 255, where the NMOS gate stack 255 comprises a dielectric layer 225A, a polysilicon layer 230A, and a polysilicon layer 245A. For purposes of this disclosure, the polysilicon layer 230A and the polysilicon layer 245A may be considered as one continuous polysilicon layer and may be equivalently referred to as polysilicon layer 247. Thus, the thickness of the polysilicon layer 247 is a sum of the thickness of the polysilicon layer 230A and the thickness of the polysilicon layer 245A. The dielectric layer 225 and the polysilicon layer 230 (FIG. 6) are also patterned and etched to form a PMOS gate stack 260, where the PMOS gate stack 260 comprises a dielectric layer 225B and a polysilicon layer 230B. For each of the NMOS gate stack 255 and the PMOS gate stack 260, the layers shown in FIG. 6 are patterned simultaneously by way of a light sensitive layer, and various (dry or wet) etchants can be used to remove each of the layers in sequence to form each of the NMOS gate stack 255 and the PMOS gate stack 260, using the patterned light sensitive layer as a mask. After etching of the layers to form the NMOS gate stack 255, the light sensitive layer, used for patterning of the layers of the NMOS gate stack 255, is removed (e.g., by an "ashing" process). Similarly, after etching of the layers to form the PMOS gate stack 260, the light sensitive layer, used for patterning of the layers of the PMOS gate stack 260, is removed (e.g., by an "ashing" process).

Figure 8:
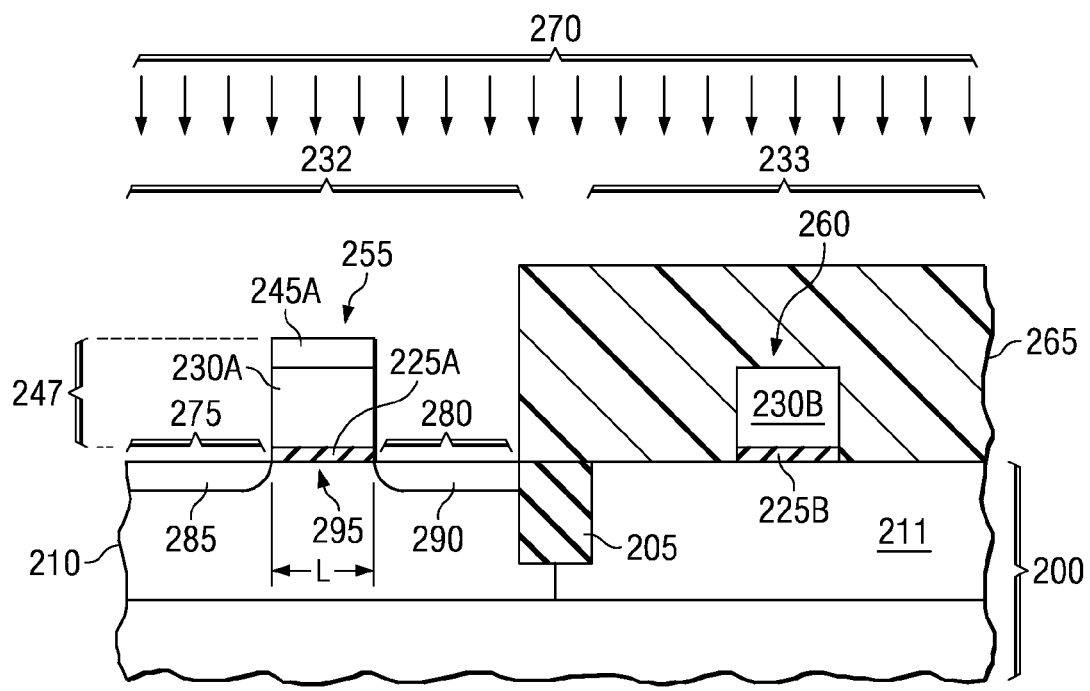
FIG. 8 shows a cross sectional view illustrating the formation of a MOS transistor after formation of source/drain extension regions in an NMOS active area.

Referring to FIG. 8, after forming the NMOS gate stack 255 and the PMOS gate stack 260 and after stripping the light sensitive layer, a light sensitive layer 265 is applied over the substrate 200, patterned using a mask (e.g., an N-type mask), and developed. Processing of the light sensitive layer 265 results in removal of the light sensitive layer 265 over the NMOS active area 232. Thereafter, an ion implantation 270 is performed using an N-type dopant species. The ion implantation 270 is performed into an active region 275 and into an active region 280 (while the light sensitive layer 265 protects the PMOS active area 233 from the ion implantation 270) in order to define a lightly doped source region 285 and a lightly doped drain region 290. In some embodiments, the NMOS gate stack 255 is also simultaneously subjected to the ion implantation 270 such that the polysilicon layer 247 is doped by the ion implantation 270; however, the NMOS gate stack 255 masks the substrate 200 from the ion implantation 270, such that the lightly doped source and drain regions 285, 290 are formed within the substrate 200 immediately adjacent to the NMOS gate stack 255. In other embodiments, the NMOS gate stack 255 is protected from the ion implantation 270 by way of a blocking layer (not shown). In some embodiments, a thin conformal oxide or nitride layer may be deposited over the gate stack 255 prior to the ion implantation 270 in order to protect sidewalls of the NMOS gate stack 255. The lightly doped source and drain regions 285, 290 may be equivalently referred to as NMOS source and drain extension regions. A channel 295 is defined between the lightly doped source region 285 and the lightly doped drain region 290, under the gate dielectric 225A, and within the substrate 200. The channel 295 has an associated channel length "L" and an associated channel width "W". In some embodiments, a thermal process, such as a rapid thermal anneal, is performed to activate the dopants within the lightly doped source and drain regions 285, 290, which may cause a slight lateral diffusion of the lightly doped source and drain regions 285, 290 under the NMOS gate stack 255. The light sensitive layer 265 is then removed (e.g., by an "ashing" process).

Figure 9:
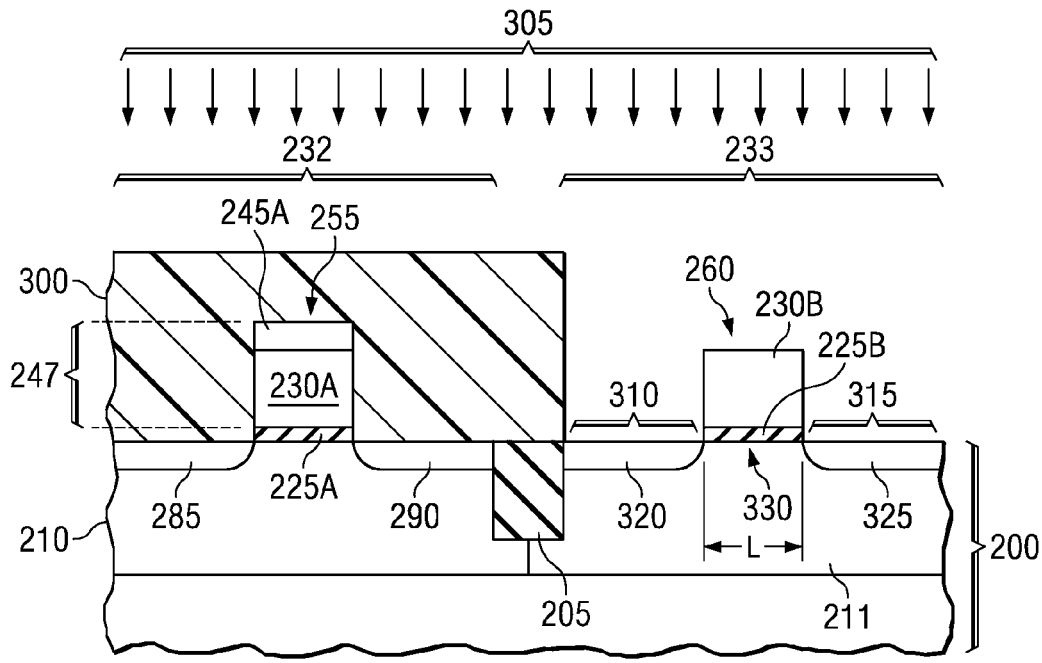
FIG. 9 shows a cross sectional view illustrating the formation of a MOS transistor after formation of source/drain extension regions in a PMOS active area.

As shown in FIG. 9, a light sensitive layer 300 is deposited over the substrate 200, patterned using a mask (e.g., a P-type mask), and developed. Processing of the light sensitive layer 300 results in removal of the light sensitive layer 300 over the PMOS active area 233. Thereafter, an ion implantation 305 is performed using a P-type dopant species. The ion implantation 305 is performed into an active region 310 and into an active region 315 (while the light sensitive layer 300 protects the NMOS active area 232 from the ion implantation 305) in order to define a lightly doped source region 320 and a lightly doped drain region 325. In some embodiments, the PMOS gate stack 260 is also simultaneously subjected to the ion implantation 305 such that the polysilicon layer 230B is doped by the ion implantation 305; however, the PMOS gate stack 260 masks the substrate 200 from the ion implantation 305, such that the lightly doped source and drain regions 320, 325 are formed within the substrate 200 immediately adjacent to the PMOS gate stack 260. In other embodiments, the PMOS gate stack 260 is protected from the ion implantation 305 by way of a blocking layer (not shown). In some embodiments, a thin conformal oxide or nitride layer may be deposited over the PMOS gate stack 260 prior to the ion implantation 305 in order to protect sidewalls of the PMOS gate stack 260. The lightly doped source and drain regions 320, 325 may be equivalently referred to as PMOS source and drain extension regions. A channel 330 is defined between the lightly doped source region 320 and the lightly doped drain region 325, under the gate dielectric 225B, and within the substrate 200. The channel 330 has an associated channel length "L" and an associated channel width "W". In some embodiments, a thermal process, such as a rapid thermal anneal, is performed to activate the dopants within the lightly doped source and drain regions 320, 325, which may cause a slight lateral diffusion of the lightly doped source and drain regions 320, 325 under the PMOS gate stack 260. The light sensitive layer 300 is then removed (e.g., by an "ashing" process).

Figure 10:
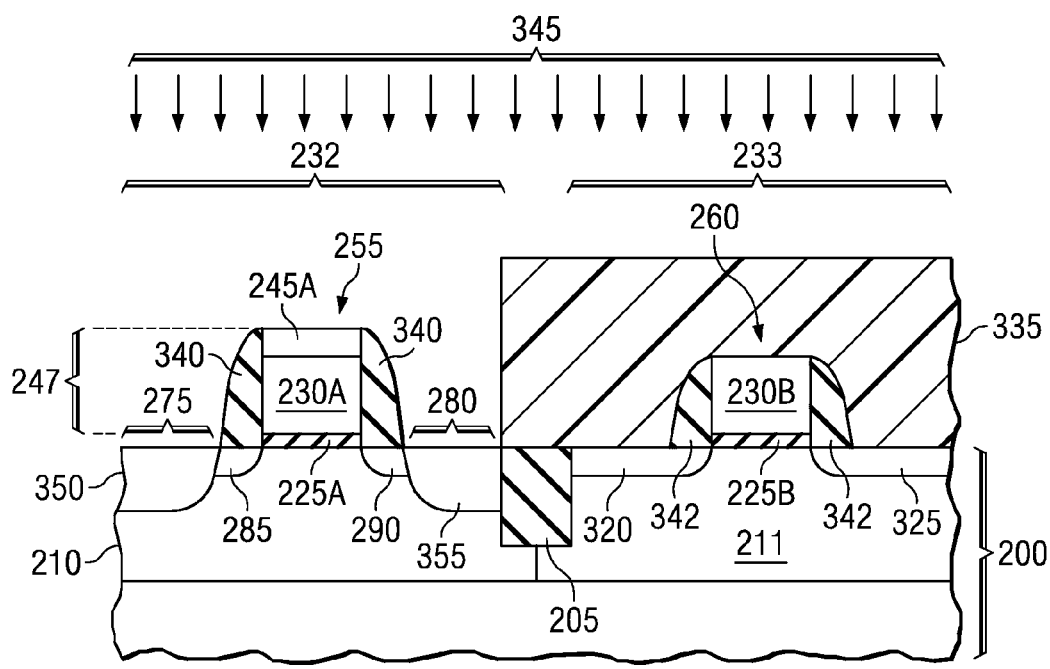
FIG. 10 shows a cross sectional view illustrating the formation of a MOS transistor after formation of source/drain regions in an NMOS active area.

Referring now to FIG. 10, a spacer 340 is then formed on each sidewall of the NMOS gate stack 255 and a spacer 342 is formed on each sidewall of the PMOS gate stack 260. Each spacer 340, 342 comprises an insulating material such as an oxide and/or nitride based material. In some embodiments, the spacers 340, 342 comprise a bistertiary-butylaminosilane (BTBAS) silicon nitride layer. The spacers 340, 342 are formed by depositing one or more layers of such material(s) over the substrate 200 in a conformal manner, followed by an anisotropic etch thereof, thereby removing spacer material from the top of the NMOS gate stack 255 and the substrate 200 (or from the top of the PMOS gate stack 260 and the substrate), while leaving the spacers 340 (or the spacers 342) on each of the sidewalls of the NMOS gate stack 255 (or the PMOS gate stack 260). Thereafter, a light sensitive layer 335 is applied over the substrate 200, patterned using a mask (e.g., an N-type mask), and developed. Processing of the light sensitive layer 335 results in removal of the light sensitive layer 335 over the NMOS active area 232. An ion implantation 345 is then performed. In particular, the ion implantation 345 is performed into the exposed portion of the active region 275 and into the exposed portion of the active region 280 (while the light sensitive layer 335 protects the PMOS active area 233 from the ion implantation 345) in order to define a source region 350 and a drain region 355. In some embodiments, the NMOS gate stack 255 and spacers 340 are also simultaneously subjected to the ion implantation 345; however, the NMOS gate stack 255 and spacers 340 mask the substrate 200 from the ion implantation 345, such that the source and drain regions 350, 355 are formed within the substrate 200 immediately adjacent to the spacers 340. In other embodiments, the NMOS gate stack 255 is protected from the ion implantation 345 by way of a blocking layer (not shown). In addition, the spacers 340 serve to protect the sidewalls of the NMOS gate stack 255. In some embodiments, a thermal process, such as a rapid thermal anneal, is performed to activate the dopants within the source and drain regions 350, 355, which may cause a slight lateral diffusion of the source and drain regions 350, 355 under the spacers 340. The light sensitive layer 335 is then removed (e.g., by an "ashing" process).

Figure 11:
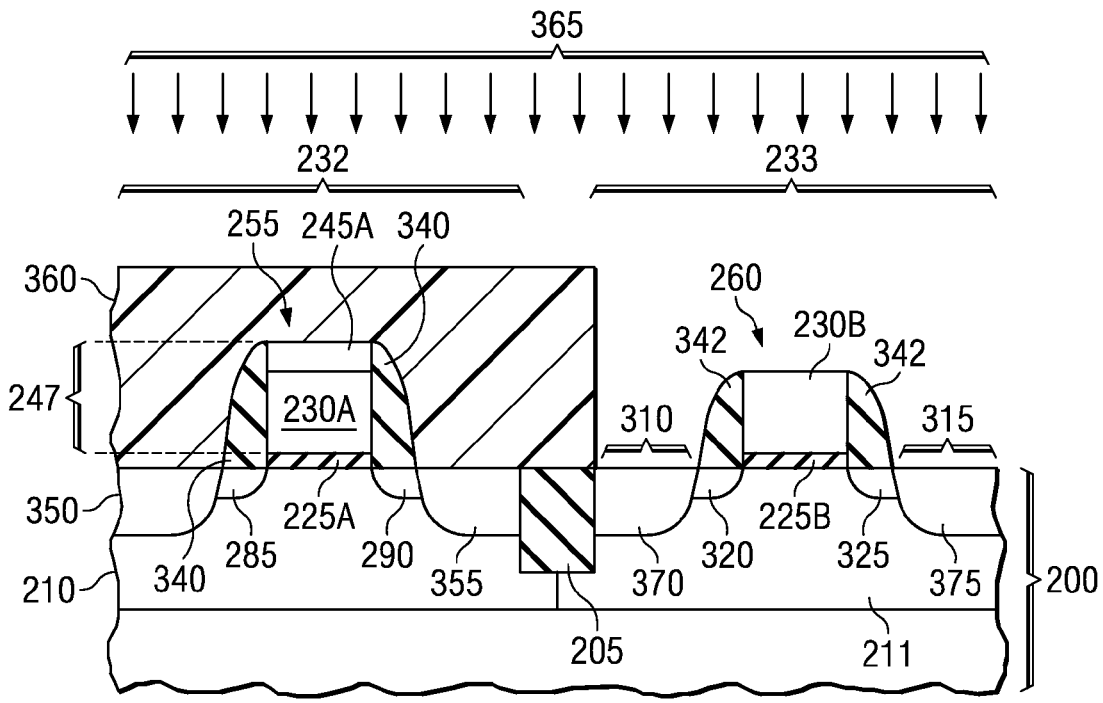
FIG. 11 shows a cross sectional view illustrating the formation of a MOS transistor after formation of source/drain regions in a PMOS active area.

As shown in FIG. 11, a light sensitive layer 360 is deposited over the substrate 200, patterned using a mask (e.g., a P-type mask), and developed. Processing of the light sensitive layer 360 results in removal of the light sensitive layer 360 over the PMOS active area 233. An ion implantation 365 is then performed. In particular, the ion implantation 365 is performed into the exposed portion of the active region 310 and into the exposed portion of the active region 315 (while the light sensitive layer 360 protects the NMOS active area 232 from the ion implantation 365) in order to define a source region 370 and a drain region 375. In some embodiments, the PMOS gate stack 260 and spacers 342 are also simultaneously subjected to the ion implantation 365; however, the PMOS gate stack 260 and spacers 342 mask the substrate 200 from the ion implantation 365, such that the source and drain regions 370, 375 are formed within the substrate 200 immediately adjacent to the spacers 342. In other embodiments, the PMOS gate stack 260 is protected from the ion implantation 365 by way of a blocking layer (not shown). In addition, the spacers 342 serve to protect the sidewalls of the PMOS gate stack 260. In some embodiments, a thermal process, such as a rapid thermal anneal, is performed to activate the dopants within the source and drain regions 370, 375, which may cause a slight lateral diffusion of the source and drain regions 370, 375 under the spacers 342. The light sensitive layer 360 is then removed (e.g., by an "ashing" process).

Figure 12:
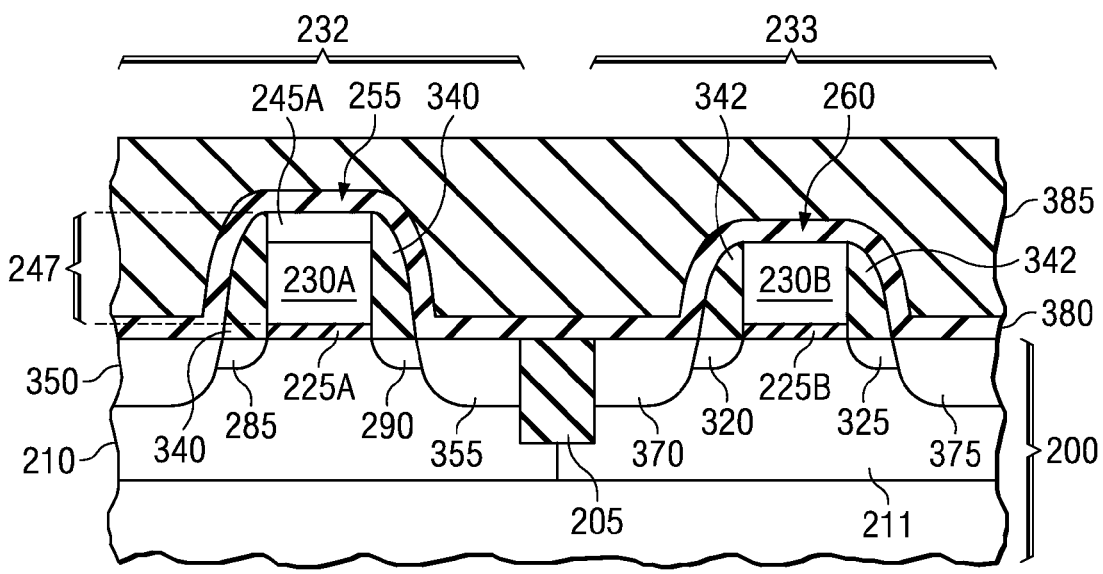
FIG. 12 shows a cross sectional view illustrating the formation of a MOS transistor after formation of a cover layer.

Referring to FIG. 12, once the source and drain regions (350, 355, 370, 375) have been formed, a cover layer 380 is formed over the substrate 200 in a conformal manner. In some embodiments, the cover layer 380 comprises a nitride layer such as a BTBAS silicon nitride layer and has a thickness of about 50-100 Angstroms. An oxide layer 385 is then formed over the cover layer 380. The oxide layer 385 may comprise, for example, a layer of tetraethyl orthosilicate (TEOS), where the oxide layer 385 is used, at least in part, to form a planarized layer over the substrate 200. In some embodiments, the oxide layer 385 has a thickness of about 2000 Angstroms. In particular, the planarization of the oxide layer 385 is performed by way of a chemical mechanical polishing (CMP) process, whereby the oxide layer 385 is mechanically polished by a polishing pad while a chemical slurry containing abrasives chemically reacts with the oxide layer 385 to increase the removal rate of the oxide layer 385. Planarization by way of a CMP process is used, for example, to bring an entire topography within a depth of field (DOF) of a given photolithography system.

Figure 13:
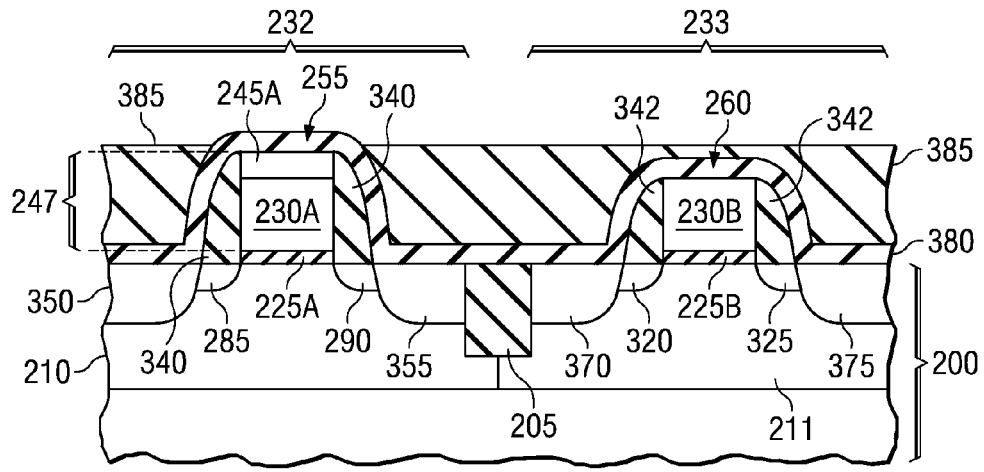
FIG. 13 shows a cross sectional view illustrating the formation of a MOS transistor after a chemical mechanical polishing (CMP) process.

As shown in FIG. 13, the oxide layer 385 is polished (e.g., by way of a CMP process), until the cover layer 380 is exposed over the NMOS gate stack 255. The cover layer 380 serves as a landing pad for the CMP process (i.e., as a CMP stopping layer) and as protection for the source and drain regions (350, 355, 370, 375) during silicidation of the polysilicon layer 247 and the polysilicon layer 230B (discussed below). In some embodiments, the cover layer 380 may also be exposed over the spacers 340. FIG. 13 also illustrates that the CMP process may not expose the cover layer 380 over the PMOS gate stack 260, which can be attributed to the difference in the polysilicon gate thickness of the NMOS gate stack 255 (i.e., the polysilicon layer 247) and the PMOS gate stack 260 (i.e., the polysilicon layer 230B). However, in some embodiments, the difference in polysilicon gate thicknesses may be small enough such that the cover layer 380 is exposed over the PMOS gate stack 260. In embodiments where the cover layer 380 is not exposed over the PMOS gate stack 260, the CMP process may be continued, after landing on the cover layer 380 over the NMOS gate stack 255, such that there is "dishing" of the oxide layer 385 over the PMOS gate stack 260. Thereafter, any oxide of the oxide layer 385 that still remains over the PMOS gate stack 260 can be removed (e.g., by way of a dry etch) thus exposing the cover layer over the PMOS gate stack 260.

Figure 14:
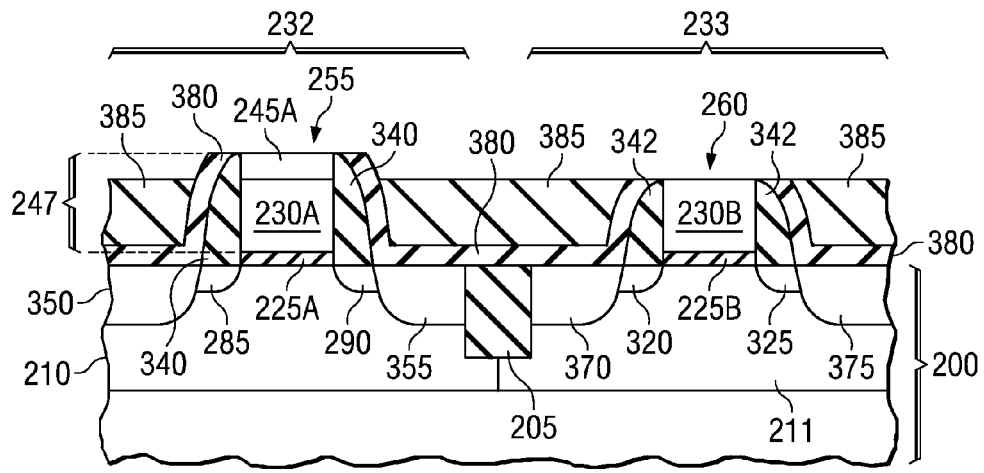
FIG. 14 shows a cross sectional view illustrating the formation of a MOS transistor after removal of the cover layer over the NMOS gate stack and over the PMOS gate stack.

Referring to FIG. 14, the exposed cover layer 380 over both the NMOS gate stack 255 and the PMOS gate stack 260 is then removed. For example, in some embodiments, removal of the exposed cover layer 380 is accomplished by a dry etch comprising a reactive ion etch (RIE). An acid (e.g., hydrofluoric acid (HF)) is then used to etch (i.e., to clean) the top of the exposed polysilicon layer 247 and the top of the exposed polysilicon layer 230B so that the subsequently formed silicide layer will be of a high quality. During the acid etch or clean of the exposed polysilicon layers 247, 230B, a portion of the oxide layer 385 is removed. In some embodiments, all of the oxide layer 385 is removed. However, the cover layer 380 is not effectively etched by the illustrative HF, and thus the cover layer 380 remains as protection for the source and drain regions (350, 355, 370, 375) during subsequent silicidation of the polysilicon layers 247, 230B.

Figure 15:
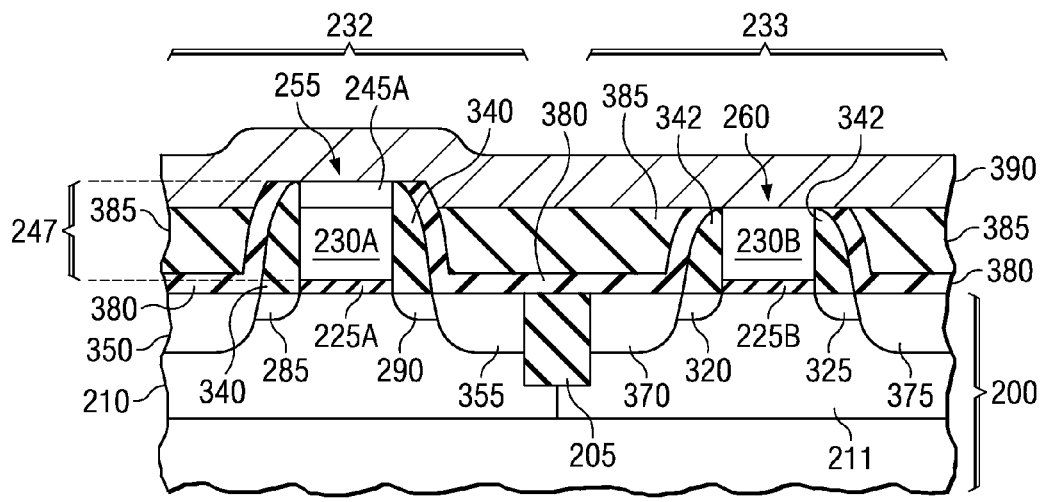
FIG. 15 shows a cross sectional view illustrating the formation of a MOS transistor after formation of a metal layer.
Figure 16:
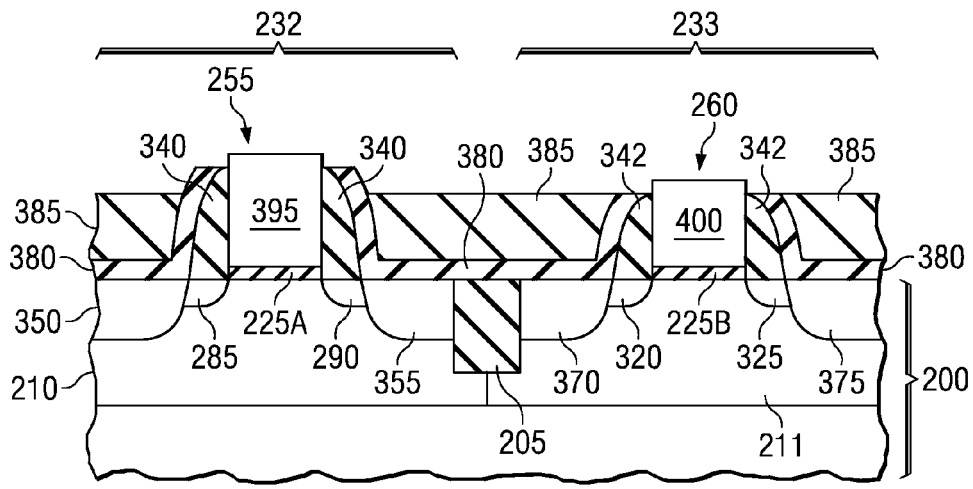
FIG. 16 shows a cross sectional view illustrating the formation of a MOS transistor after silicidation of an NMOS gate and a PMOS gate.

In FIG. 15, a metal layer 390 (e.g., nickel) is formed over the substrate 200 as a precursor to simultaneous silicidation of the polysilicon layers 247, 230B. In some embodiments, the metal layer 390 is formed by a physical method, such as evaporation or sputtering. After formation of the metal layer 390, an anneal is performed to induce a reaction between the metal layer 390 and the polysilicon layers 247, 230B, thus simultaneously siliciding the polysilicon gates of both NMOS and PMOS transistors. As shown in FIG. 16, the reaction between the metal layer 390 and the polysilicon layers 247, 230B (FIG. 15) creates a silicide layer 395 which serves as the transistor gate electrode for the NMOS transistor formed in the NMOS active area 232, and a silicide layer 400 which serves as the transistor gate electrode for the PMOS transistor formed in the PMOS active area 233. In some embodiments, the silicide layers 395, 400 comprise nickel silicide (NiSi) layers. During the silicidation process, metal from the metal layer 390 reacts with the entire polysilicon layer 247 (FIG. 15) and with the entire polysilicon layer 230B (FIG. 15) to form the fully silicided NMOS and PMOS metal gates. While the polysilicon layer 247 (FIG. 15) and the polysilicon layer 230B (FIG. 15) have different silicidation rates (due to the differences in doping), the difference in the thickness of the polysilicon layer 247 (FIG. 15) and the thickness of the polysilicon layer 230B (FIG. 15) compensates for the different silicidation rates, resulting in fully silicided NMOS and PMOS gates. Unreacted metal is then removed, for example, by way of a wet chemical etch. The source and drain regions (350, 355, 370, 375) remain protected from the silicidation process by the cover layer 380. In addition, the thermal budget used to induce the reaction between the metal layer 390 and the polysilicon layers 247, 230B is low as compared to, for example, the thermal budget used for activation of the source and drain regions (350, 355, 370, 375). Therefore, the FUSI process can be performed after higher thermal budget processing is complete. In some embodiments, after the silicide layers 395, 400 are formed, another anneal may be performed in order to change the phase of the silicide layers 395, 400 into a low-resistance phase. In yet other embodiments, the thermal budget used to induce the reaction between the metal layer 390 and the polysilicon layers 247, 230B can be varied in order to form silicide layers 395, 400 having one of a plurality of phases, where the phase of the silicide layer determines, at least in part, the work function of the silicide layer. FIG. 16 also illustrates that there is a net volume expansion of the polysilicon layers 247, 230B (FIG. 15) upon silicidation. In some embodiments, the top of the silicide layers 395, 400 is substantially higher than the top of the spacers 340, 342. In other embodiments, the top of the silicide layers 395, 400 is substantially equal to the top of the spacers 340, 342. In yet other embodiments, the top of the silicide layers 395, 400 is substantially lower that the top of the spacers 340, 342.

Figure 17:
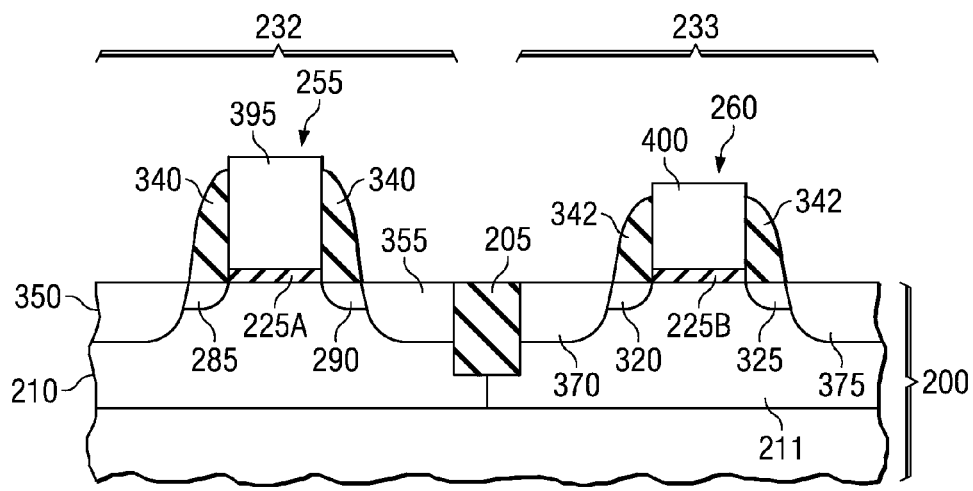
FIG. 17 shows a cross sectional view illustrating the formation of a MOS transistor after removal of the cover layer.
Figure 18:
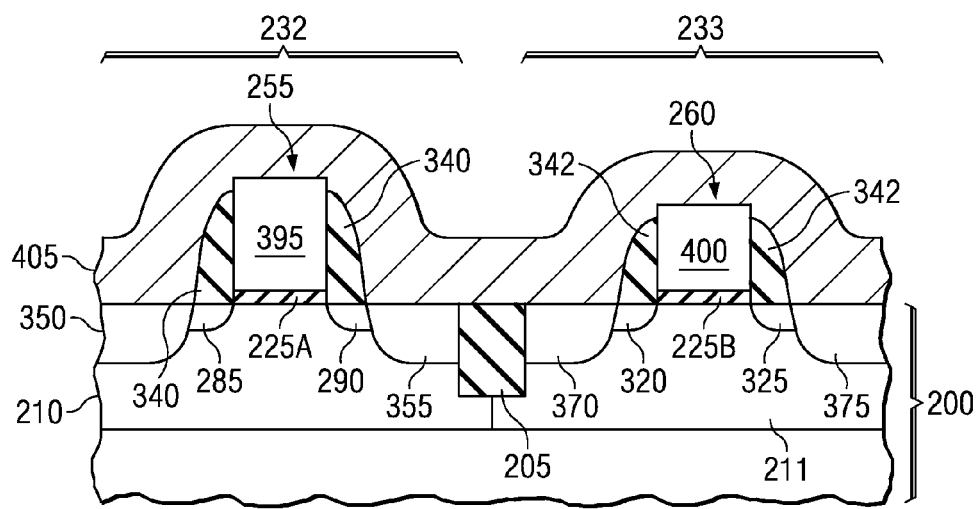
FIG. 18 shows a cross sectional view illustrating the formation of a MOS transistor after formation of a metal layer used to silicide the source/drain regions.
Figure 19:
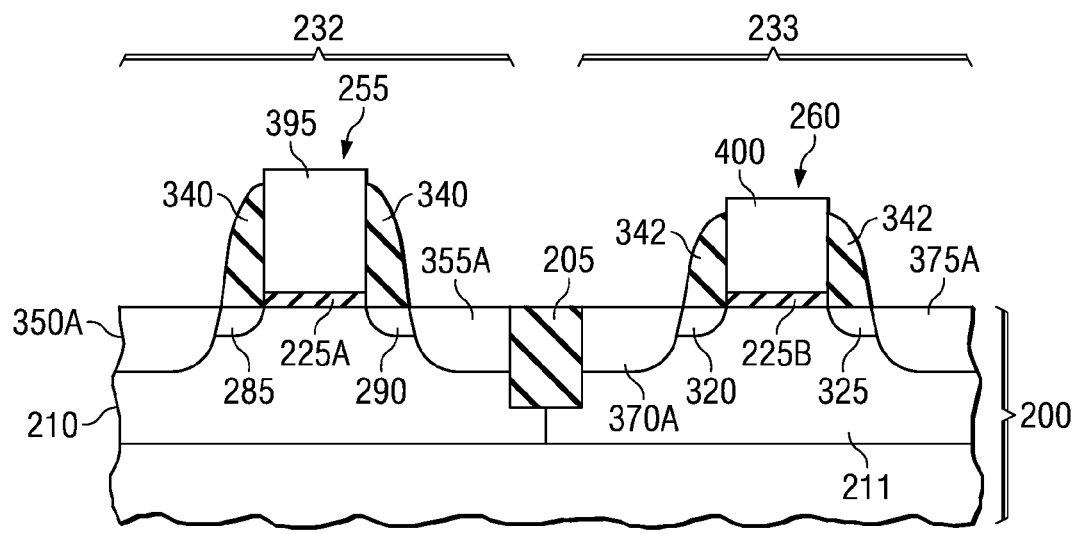
FIG. 19 shows a cross sectional view illustrating the formation of a MOS transistor after silicidation of the source/drain regions.

Referring to FIG. 17, after formation of the silicide layers 395, 400, any of the remaining oxide layer 385 (FIG. 16) is removed (e.g., with an HF etch), and the cover layer 380 (FIG. 16) is removed (e.g., by way of a dry etch). FIG. 18 illustrates that a metal layer 405 (e.g., nickel) is formed over the substrate 200 in order to perform a silicidation of the source and drain regions (350, 355, 370, 375). The metal layer 405 may be formed by any suitable method, and an anneal is performed to induce a reaction between the metal layer 405 and the source and drain regions (350, 355, 370, 375). As shown in FIG. 19, silicided source and drain regions (350A, 355A, 370A, 375A), which comprise, for example, nickel silicide (NiSi) regions are then formed, and unreacted metal is removed. Since the gate electrodes (i.e., silicide layers 395, 400) have already been fully silicided, silicidation of the source and drain regions does not affect the silicide layers 395, 400. Thereafter, other CMOS processing may follow (e.g., interlayer dielectric and metallization layers can be formed).

Figure 20:
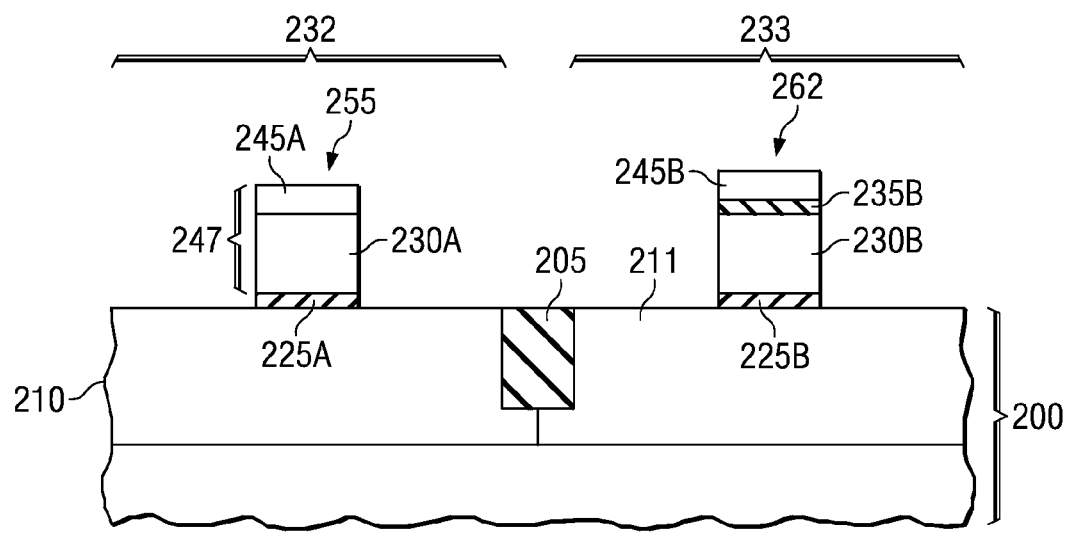
FIG. 20 shows a cross sectional view illustrating the formation of a MOS transistor after formation of an NMOS gate stack and a PMOS gate stack according to other embodiments.

Referring now to the process flow illustrated in FIGS. 20-34, the oxide layer 235 and the polysilicon layer 245 (FIG. 5) are removed from the PMOS active area 233, and thus the difference in thickness for the NMOS and PMOS polysilicon gates is created, after patterning and etching to form the NMOS gate stack and the PMOS gate stack. As shown in FIG. 20, the dielectric layer 225, the polysilicon layer 230, and the polysilicon layer 245 (FIG. 5) have been patterned and etched to form the NMOS gate stack 255. The dielectric layer 225, the polysilicon layer 230, the oxide layer 235, and the polysilicon layer 245 (FIG. 5) are also patterned and etched to form a PMOS gate stack 262, where the PMOS gate stack 262 comprises a dielectric layer 225B, a polysilicon layer 230B, an oxide layer 235B, and a polysilicon layer 245B. For each of the NMOS gate stack 255 and the PMOS gate stack 262, the layers shown in FIG. 5 are patterned simultaneously by way of a light sensitive layer, and various (dry or wet) etchants can be used to remove each of the layers in sequence to form each of the NMOS gate stack 255 and the PMOS gate stack 262, using the patterned light sensitive layer as a mask. After etching of the layers to form the NMOS gate stack 255, the light sensitive layer, used for patterning of the layers of the NMOS gate stack 255, is removed (e.g., by an "ashing" process). Similarly, after etching of the layers to form the PMOS gate stack 262, the light sensitive layer, used for patterning of the layers of the PMOS gate stack 262, is removed (e.g., by an "ashing" process).

Figure 21:
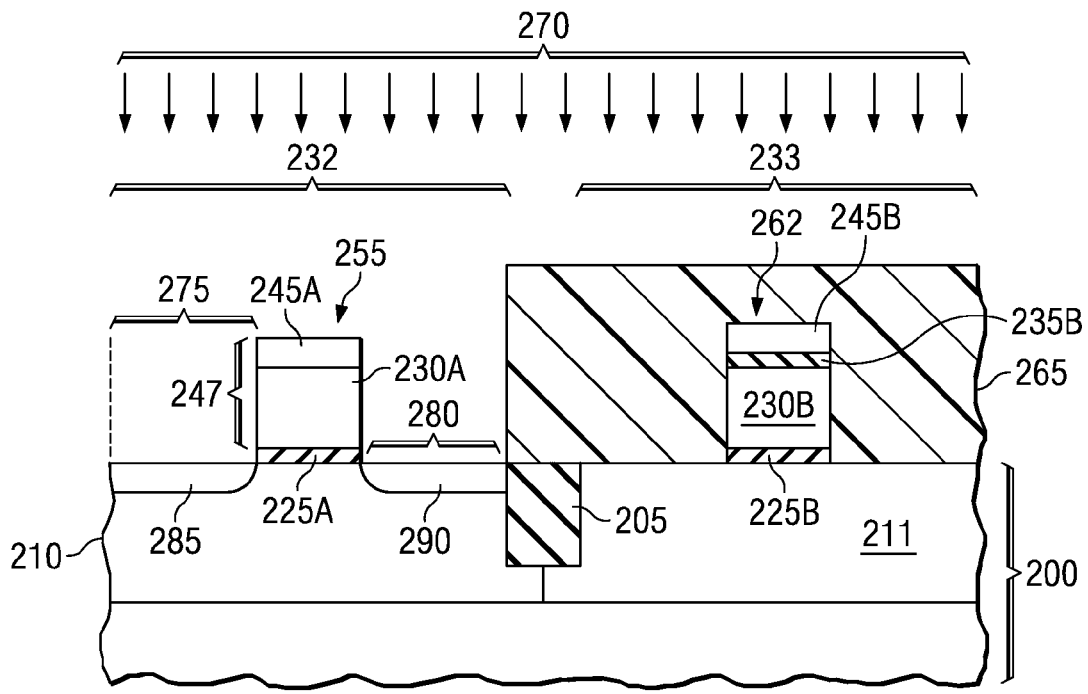
FIG. 21 shows a cross sectional view illustrating the formation of a MOS transistor after formation of source/drain extension regions in an NMOS active area according to other embodiments.

Referring to FIG. 21, after forming the NMOS gate stack 255 and the PMOS gate stack 262 and after stripping the light sensitive layer, a light sensitive layer 265 is applied over the substrate 200, patterned using a mask (e.g., an N-type mask), and developed. Processing of the light sensitive layer 265 results in removal of the light sensitive layer 265 over the NMOS active area 232. Thereafter, an ion implantation 270 is performed using an N-type dopant species to define lightly doped source and drain regions 285, 290. The light sensitive layer 265 is then removed (e.g., by an "ashing" process).

Figure 22:
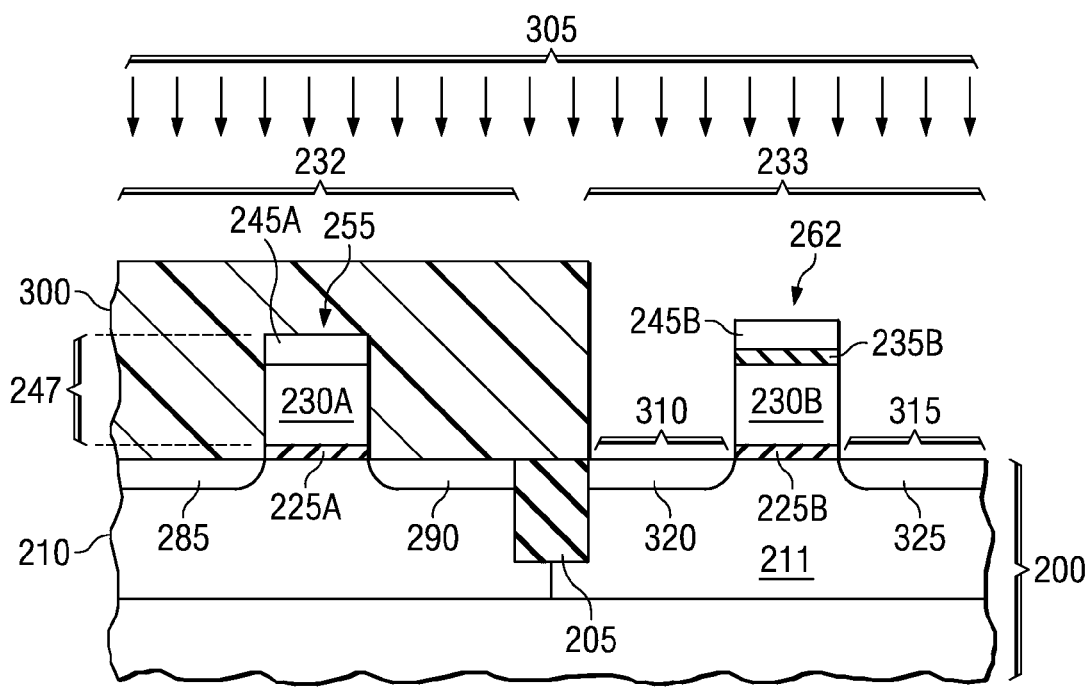
FIG. 22 shows a cross sectional view illustrating the formation of a MOS transistor after formation of source/drain extension regions in a PMOS active area according to other embodiments.

As shown in FIG. 22, a light sensitive layer 300 is deposited over the substrate 200, patterned using a mask (e.g., a P-type mask), and developed. Processing of the light sensitive layer 300 results in removal of the light sensitive layer 300 over the PMOS active area 233. Thereafter, an ion implantation 305 is performed using a P-type dopant species to define lightly doped source and drain regions 320, 325. In some embodiments, the PMOS gate stack 262 is also simultaneously subjected to the ion implantation 305; however, the PMOS gate stack 262 masks the substrate 200 from the ion implantation 305, such that the lightly doped source and drain regions 320, 325 are formed within the substrate 200 immediately adjacent to the PMOS gate stack 262. In other embodiments, the PMOS gate stack 262 is protected from the ion implantation 305 by way of a blocking layer (not shown). In some embodiments, a thin conformal oxide or nitride layer may be deposited over the PMOS gate stack 262 prior to the ion implantation 305 in order to protect sidewalls of the PMOS gate stack 262. In some embodiments, a thermal process, such as a rapid thermal anneal, is performed to activate the dopants within the lightly doped source and drain regions 320, 325, which may cause a slight lateral diffusion of the lightly doped source and drain regions 320, 325 under the PMOS gate stack 262. The light sensitive layer 300 is then removed (e.g., by an "ashing" process).

Figure 23:
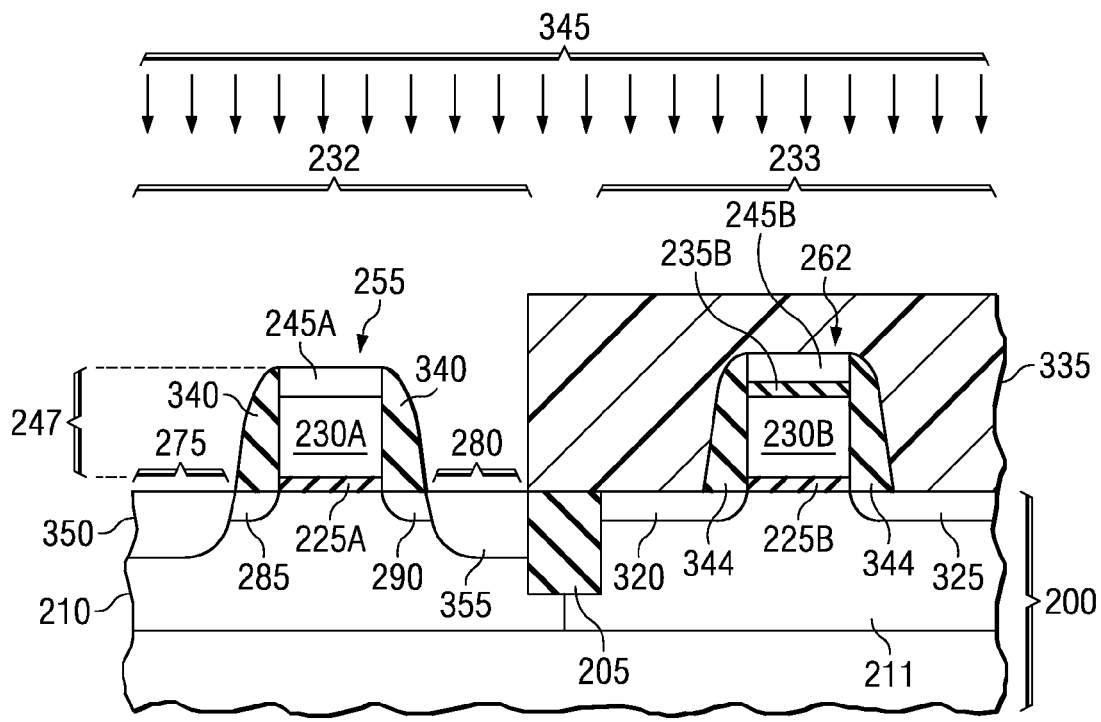
FIG. 23 shows a cross sectional view illustrating the formation of a MOS transistor after formation of source/drain regions in an NMOS active area according to other embodiments.

Referring now to FIG. 23, a spacer 340 is then formed on each sidewall of the NMOS gate stack 255 and a spacer 344 is formed on each sidewall of the PMOS gate stack 262. Each spacer 340, 344 comprises an insulating material such as an oxide and/or nitride based material. Thereafter, a light sensitive layer 335 is applied over the substrate 200, patterned using a mask (e.g., an N-type mask), and developed. Processing of the light sensitive layer 335 results in removal of the light sensitive layer 335 over the NMOS active area 232. An ion implantation 345 is then performed to define source and drain regions 350, 355. The light sensitive layer 335 is then removed (e.g., by an "ashing" process).

Figure 24:
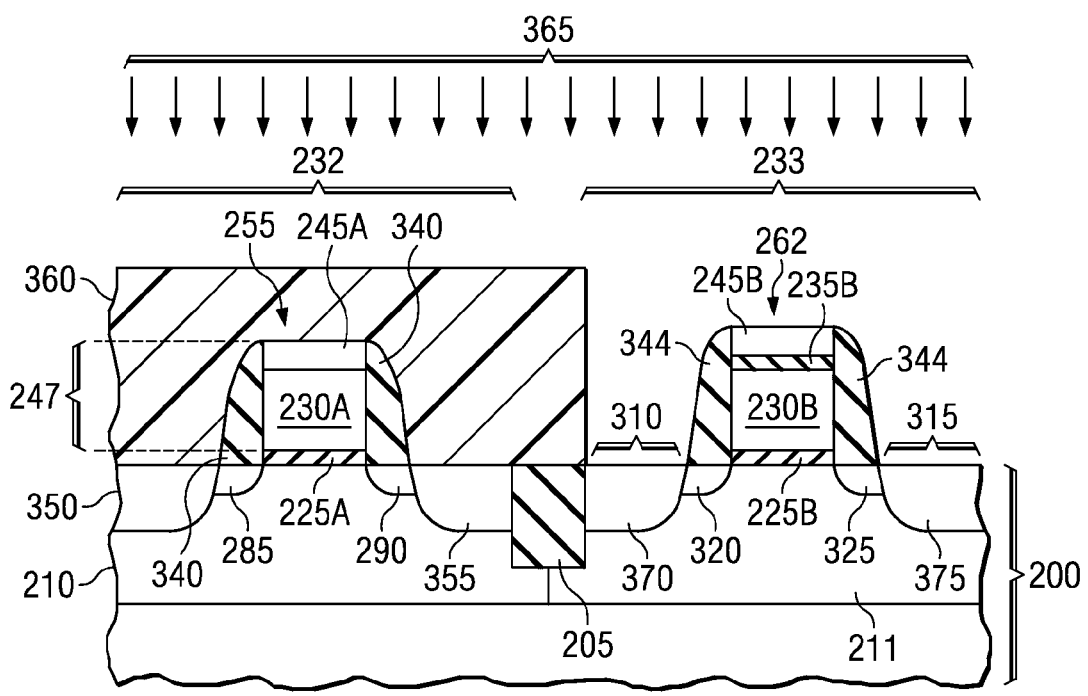
FIG. 24 shows a cross sectional view illustrating the formation of a MOS transistor after formation of source/drain regions in a PMOS active area according to other embodiments.

As shown in FIG. 24, a light sensitive layer 360 is deposited over the substrate 200, patterned using a mask (e.g., a P-type mask), and developed. Processing of the light sensitive layer 360 results in removal of the light sensitive layer 360 over the PMOS active area 233. An ion implantation 365 is then performed to define source and drain regions 370, 375. In some embodiments, the PMOS gate stack 262 and spacers 344 are also simultaneously subjected to the ion implantation 365; however, the PMOS gate stack 262 and spacers 344 mask the substrate 200 from the ion implantation 365, such that the source and drain regions 370, 375 are formed within the substrate 200 immediately adjacent to the spacers 344. In other embodiments, the PMOS gate stack 262 is protected from the ion implantation 365 by way of a blocking layer (not shown). In addition, the spacers 344 serve to protect the sidewalls of the PMOS gate stack 262. In some embodiments, a thermal process, such as a rapid thermal anneal, is performed to activate the dopants within the source and drain regions 370, 375, which may cause a slight lateral diffusion of the source and drain regions 370, 375 under the spacers 344. The light sensitive layer 360 is then removed (e.g., by an "ashing" process).

Figure 25:
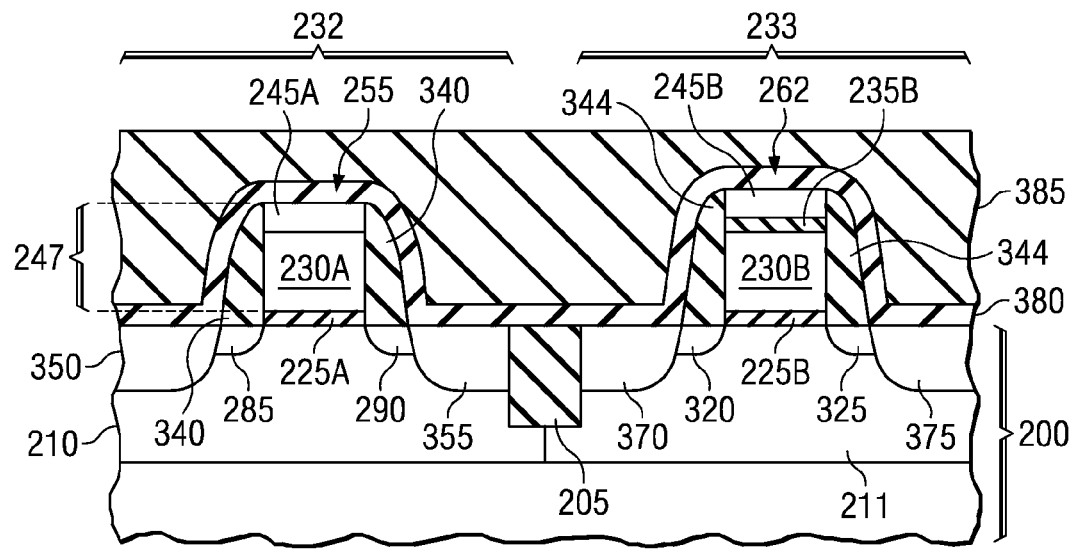
FIG. 25 shows a cross sectional view illustrating the formation of a MOS transistor after formation of a cover layer according to other embodiments.
Figure 26:
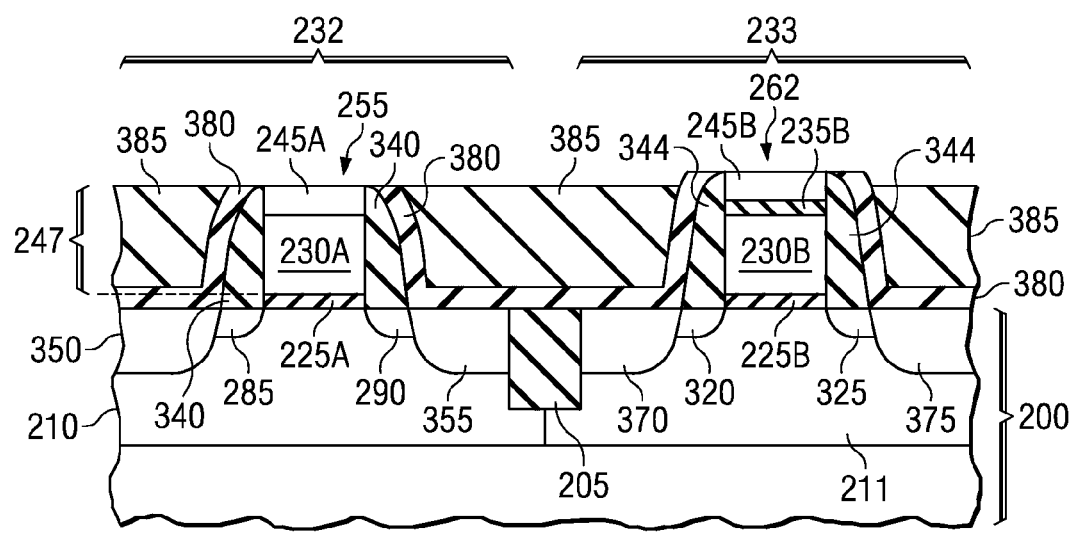
FIG. 26 shows a cross sectional view illustrating the formation of a MOS transistor after a chemical mechanical polishing (CMP) process and removal of the cover layer over the NMOS gate stack and the PMOS gate stack.

Referring to FIG. 25, once the source and drain regions (350, 355, 370, 375) have been formed, a cover layer 380 is formed over the substrate 200 in a conformal manner. An oxide layer 385 is then formed over the cover layer 380, and planarization of the oxide layer 385 is performed by way of a chemical mechanical polishing (CMP) process. As shown in FIG. 26, the oxide layer 385 is polished (e.g., by way of a CMP process), until the cover layer 380 is exposed over the NMOS gate stack 255 and over the PMOS gate stack 262. In some embodiments, the cover layer 380 may also be exposed over the spacers 340, 344. In some embodiments, the CMP process may not expose the cover layer 380 over the NMOS gate stack 255, which can be attributed to the difference in the thickness of the NMOS gate stack 255 (comprising the dielectric layer 225A and the polysilicon layer 247) and the PMOS gate stack 262 (comprising the dielectric layer 225B, the polysilicon layer 230B, the oxide layer 235B, and the polysilicon layer 245B). However, in some embodiments, the difference in gate stack thicknesses may be small enough such that the cover layer 380 is exposed over the NMOS gate stack 255. In embodiments where the cover layer 380 is not exposed over the NMOS gate stack 255, the CMP process may be continued, after landing on the cover layer 380 over the PMOS gate stack 262, such that there is "dishing" of the oxide layer 385 over the NMOS gate stack 255. Thereafter, any oxide of the oxide layer 385 that still remains over the NMOS gate stack 255 can be removed (e.g., by way of a dry etch) thus exposing the cover layer over the NMOS gate stack 255. Thereafter, the exposed cover layer 380 over both the NMOS gate stack 255 and the PMOS gate stack 262 is removed.

Figure 27:
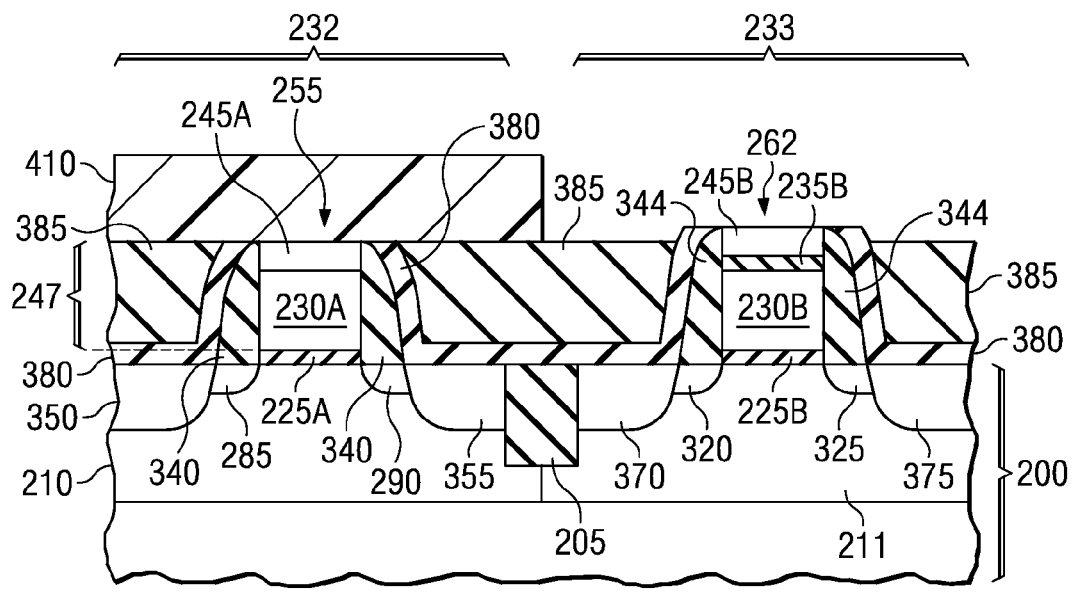
FIG. 27 shows a cross sectional view illustrating the formation of a MOS transistor after patterning to expose the PMOS active area.
Figure 28:
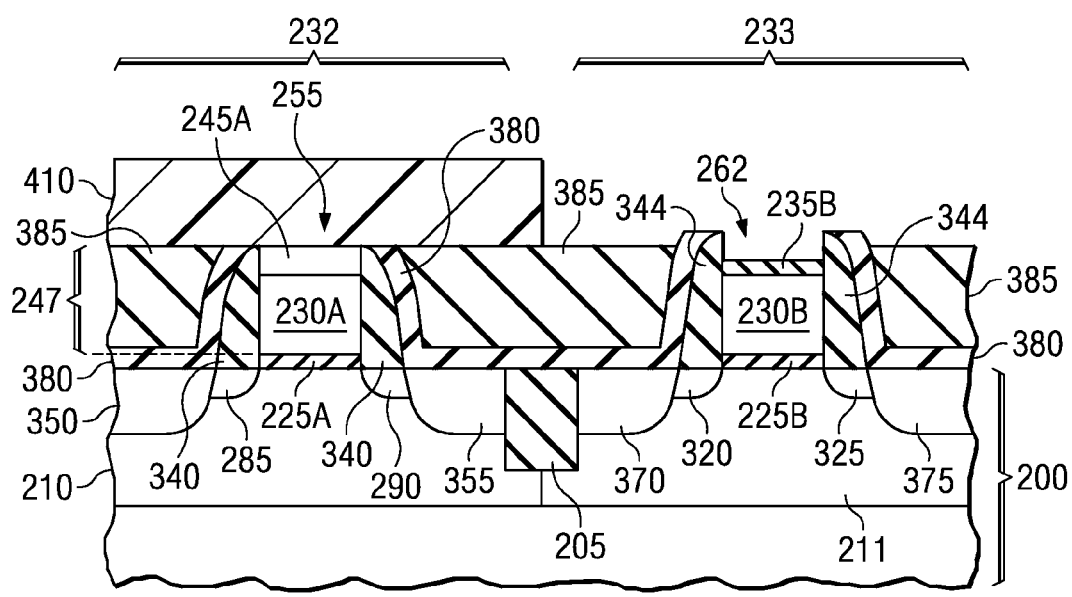
FIG. 28 shows a cross sectional view illustrating the formation of a MOS transistor after removal of a polysilicon layer of the PMOS gate stack.
Figure 29:
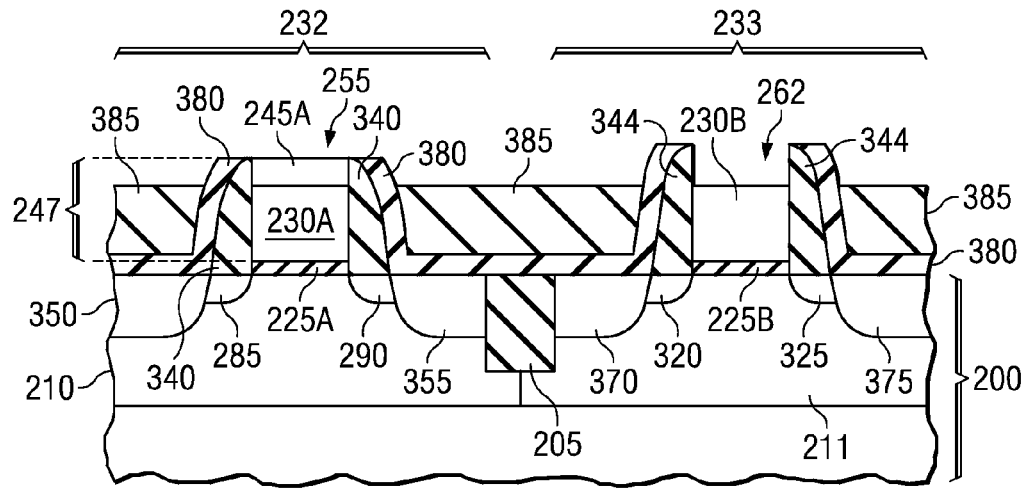
FIG. 29 shows a cross sectional view illustrating the formation of a MOS transistor after removal of an oxide layer of the PMOS gate stack.

Referring to FIG. 27, a light sensitive layer 410 is deposited over the substrate 200, patterned using a mask (e.g., a P-type mask), and developed. Processing of the light sensitive layer 410 results in removal of the light sensitive layer 410 over the PMOS active area 233. Thereafter, as shown in FIG. 28, the polysilicon layer 245B is removed from the PMOS gate stack 262 (e.g., by way of a dry etch) while the polysilicon layer 247 over the NMOS active area 232 is protected by the light sensitive layer 410. As shown in FIG. 29, the light sensitive layer 410 (FIG. 28) has been removed (e.g., by an "ashing" process), and the oxide layer 235B has been removed from the PMOS gate stack 262 by deglazing (e.g., with HF acid). Thus, the delta in polysilicon gate thicknesses between NMOS and PMOS transistors is created and subsequent simultaneous silicidation of the NMOS polysilicon gate (e.g., doped with an N-type dopant) and the PMOS polysilicon gate (e.g., doped with a P-type dopant, or undoped) will result in fully silicided NMOS and PMOS transistor gate electrodes. An acid (e.g., hydrofluoric acid (HF)) is then used to etch (i.e., to clean) the top of the exposed polysilicon layer 247 and the top of the exposed polysilicon layer 230B so that the subsequently formed silicide layer will be of a high quality.

Figure 30:
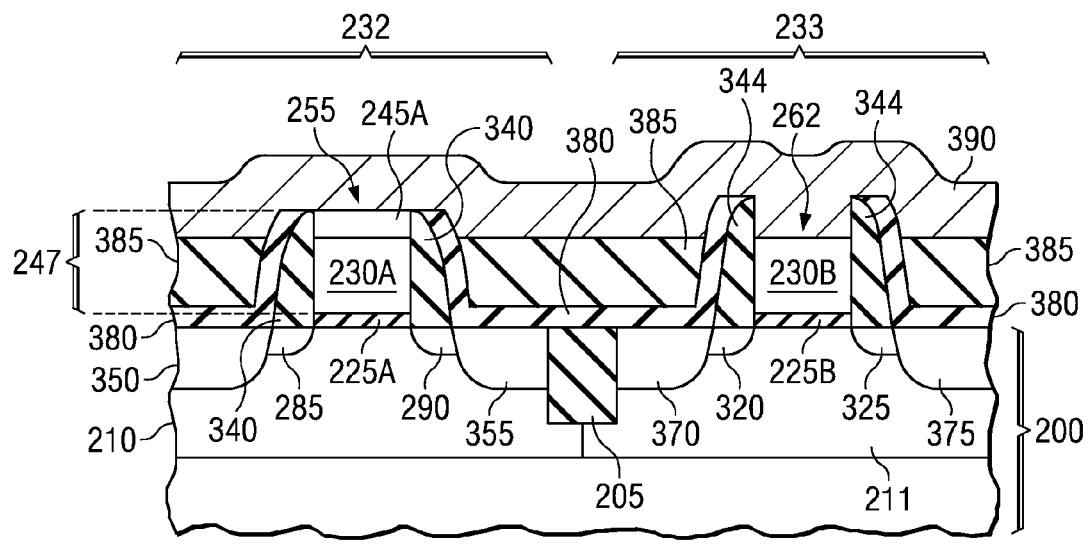
FIG. 30 shows a cross sectional view illustrating the formation of a MOS transistor after formation of a metal layer according to other embodiments.
Figure 31:
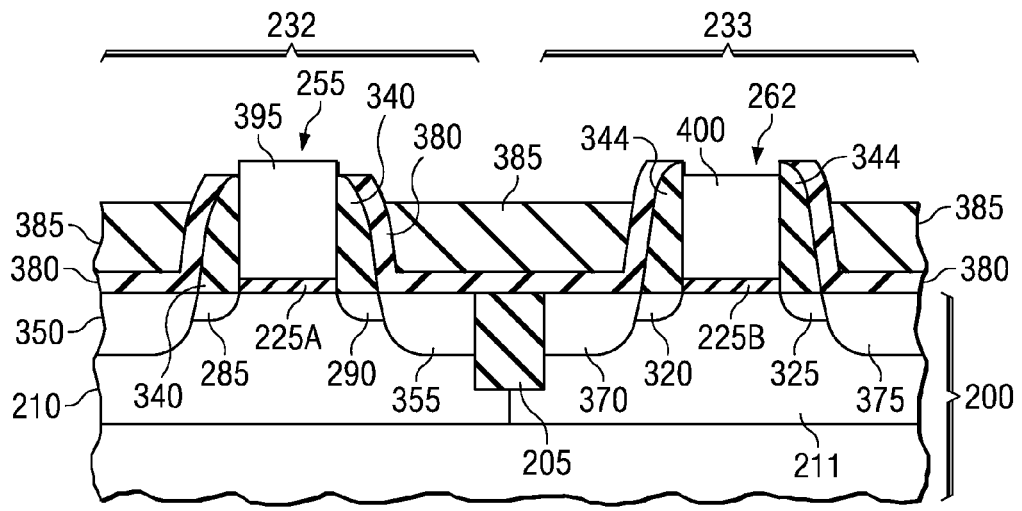
FIG. 31 shows a cross sectional view illustrating the formation of a MOS transistor after silicidation of an NMOS gate and a PMOS gate according to other embodiments.

In FIG. 30, a metal layer 390 (e.g., nickel) is formed over the substrate 200 as a precursor to simultaneous silicidation of the polysilicon layers 247, 230B. After formation of the metal layer 390, an anneal is performed to induce a reaction between the metal layer 390 and the polysilicon layers 247, 230B, thus simultaneously siliciding the polysilicon gates of both NMOS and PMOS transistors. As shown in FIG. 31, the reaction between the metal layer 390 and the polysilicon layers 247, 230B creates a silicide layer 395 which serves as the transistor gate electrode for the NMOS transistor formed in the NMOS active area 232, and a silicide layer 400 which serves as the transistor gate electrode for the PMOS transistor formed in the PMOS active area 233. Unreacted metal is then removed, for example, by way of a wet chemical etch.

Figure 32:
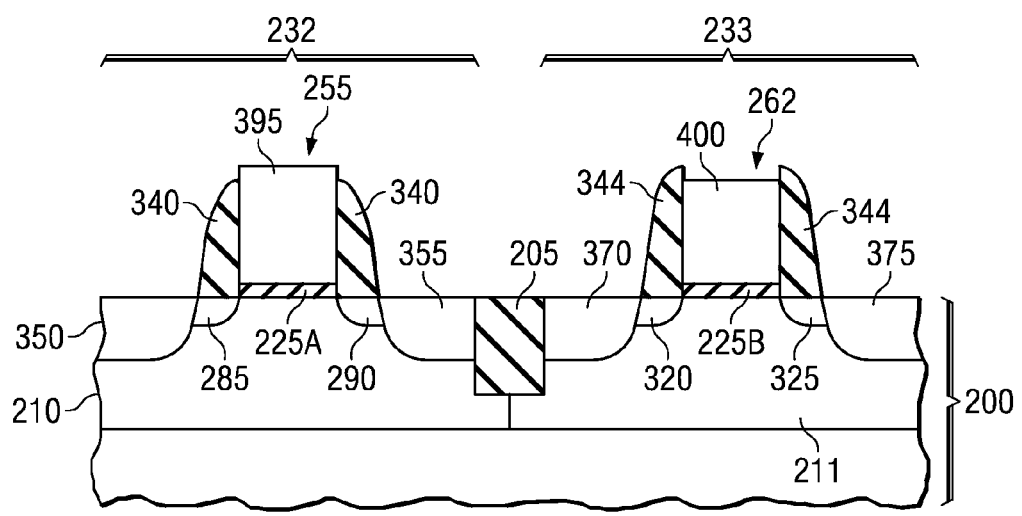
FIG. 32 shows a cross sectional view illustrating the formation of a MOS transistor after removal of the cover layer according to other embodiments.
Figure 33:
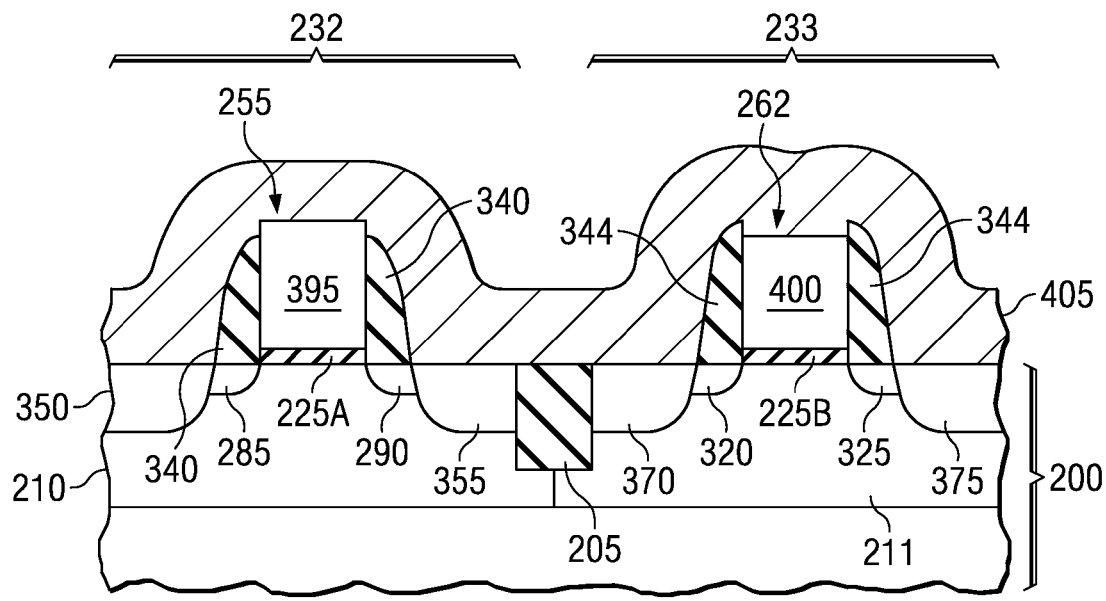
FIG. 33 shows a cross sectional view illustrating the formation of a MOS transistor after formation of a metal layer used to silicide the source/drain regions according to other embodiments.
Figure 34:
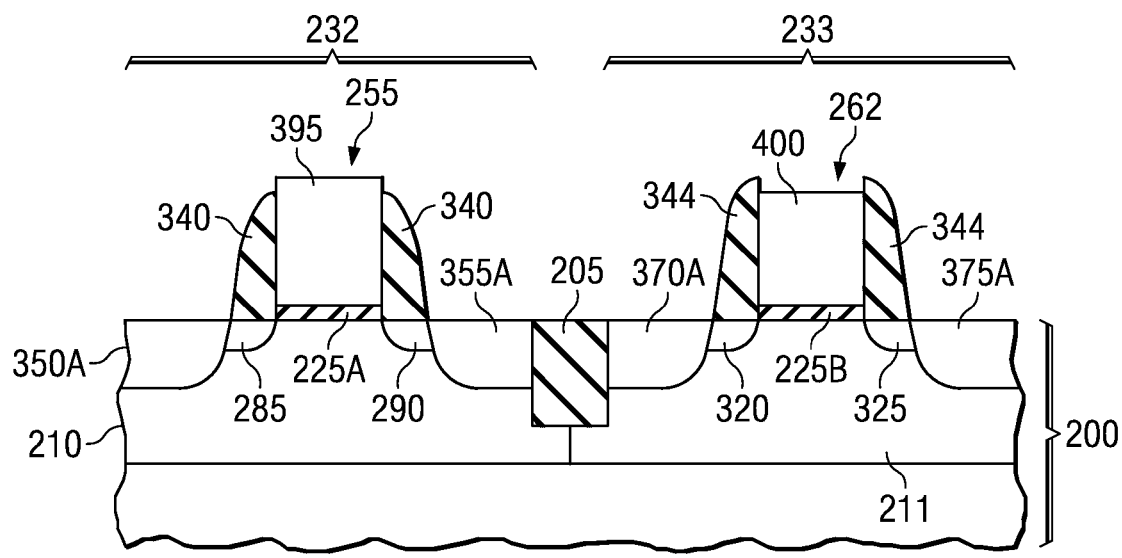
FIG. 34 shows a cross sectional view illustrating the formation of a MOS transistor after silicidation of the source/drain regions according to other embodiments.

Referring to FIG. 32, after formation of the silicide layers 395, 400, any of the remaining oxide layer 385 (FIG. 31) is removed (e.g., with an HF etch), and the cover layer 380 (FIG. 31) is removed (e.g., by way of a dry etch). FIG. 33 illustrates that a metal layer 405 (e.g., nickel) is formed over the substrate 200 in order to perform a silicidation of the source and drain regions (350, 355, 370, 375). An anneal is performed to induce a reaction between the metal layer 405 and the source and drain regions (350, 355, 370, 375). As shown in FIG. 34, silicided source and drain regions (350A, 355A, 370A, 375A), which comprise, for example, nickel silicide (NiSi) regions are then formed. Unreacted metal is then removed. Thereafter, other CMOS processing may follow (e.g., inter-layer dielectric and metallization layers can be formed).

The above discussion is meant to be illustrative of the principles and various embodiments of the present invention. Numerous variations and modifications will become apparent to those skilled in the art once the above disclosure is fully appreciated. For example, unless otherwise indicated, any one or more of the layers set forth herein can be formed in any number of suitable ways (e.g., with spin-on techniques, sputtering techniques (e.g., magnetron and/or ion beam sputtering), thermal growth techniques, deposition techniques such as chemical vapor deposition (CVD), physical vapor deposition (PVD) and/or plasma enhanced chemical vapor deposition (PECVD), or atomic layer deposition (ALD)). Also, unless otherwise indicated, any one or more of the layers can be patterned in any suitable manner (e.g., via lithographic and/or etching techniques). It is intended that the following claims be interpreted to embrace all such variations and modifications.

What is claimed is:

1. A method comprising:
   forming an N-type gate over a semiconductor substrate, the N-type gate having a first thickness;
   forming a P-type gate over the semiconductor substrate, the P-type gate having a second thickness different than the first thickness;
   forming spacers on sidewalls of the N-type gate having the first thickness and sidewalls of the P-type gate having the second thickness, the spacers being formed simultaneously;
   forming source and drain regions adjacent to the spacers, the source and drain regions containing no silicide layer;
   forming a conformal cover layer over the semiconductor substrate;
   removing the conformal cover layer over the N-type gate and the P-type gate;
   performing a simultaneous silicidation of the N-type gate and the P-type gate after the step of forming the source and drain regions containing no silicide layer, the source and drain regions containing no silicide layer being protected by the conformal cover layer from the simultaneous silicidation of the N-type gate and the P-type gate;
   removing remaining portions of the conformal cover layer; and
   performing a simultaneous silicidation of all the source and drain regions after the step of removing remaining portions of the conformal cover layer;
   wherein each of the forming the N-type gate and forming the P-type gate further comprises:
      forming a first polysilicon layer over the semiconductor substrate;
      forming an oxide layer over the first polysilicon layer;
      removing the oxide layer over the first polysilicon layer of the N-type gate; and
      forming a second polysilicon layer over the oxide layer.

2. The method according to claim 1 wherein removing the oxide layer over the first polysilicon layer of the N-type gate comprises deglazing the oxide layer.

3. The method according to claim 2 wherein forming the N-type gate further comprises:
   patterning the N-type gate; and
   etching to form the N-type gate.

4. The method according to claim 1 wherein forming the first polysilicon layer further comprises forming the first polysilicon layer having a thickness of about 600 Angstroms.

5. The method according to claim 2 wherein forming the P-type gate further comprises:
   etching the second polysilicon layer; and
   deglazing the oxide layer.

6. The method according to claim 5 wherein forming the P-type gate further comprises:
   patterning the P-type gate; and
   etching to form the P-type gate.

7. The method according to claim 1 wherein forming the oxide layer further comprises forming the oxide layer having a thickness of about 20-25 Angstroms.

8. The method according to claim 1 wherein forming the second polysilicon layer further comprises forming the second polysilicon layer having a thickness of about 200 Angstroms.

9. The method according to claim 1 wherein the first thickness is greater than the second thickness.

10. The method according to claim 1 wherein performing the simultaneous silicidation comprises:
    forming a metal layer over the semiconductor substrate;
    annealing to induce a reaction between the N-type gate and the metal layer, and between the P-type gate and the metal layer; and
    removing unreacted metal of the metal layer.

11. The method according to claim 1 wherein forming the N-type gate further comprises doping the N-type gate with an N-type dopant.

12. The method according to claim 1 wherein forming the P-type gate further comprises doping the P-type gate with a P-type dopant.

13. The method according to claim 1 wherein the step of performing the simultaneous silicidation results in the N-type gate being fully silicided plus the P-type gate being fully silicided.

14. The method according to claim 1 wherein the step of performing the simultaneous silicidation results in one of the N-type gate and the P-type gate being fully silicided.

15. The method according to claim 1 wherein the simultaneous silicidation of the N-type and P-type gates forms fully silicided N-type and P-type gates.

16. A method comprising:
    forming an NMOS gate over a semiconductor substrate, the NMOS gate having a first thickness;
    forming a PMOS gate over the semiconductor substrate, the PMOS gate having a second thickness different than the first thickness and the PMOS gate being undoped;
    forming spacers on sidewalls of the NMOS gate having the first thickness and sidewalls of the PMOS gate having the second thickness, the spacers being formed simultaneously;
    forming source and drain regions adjacent to the spacers, the source and drain regions containing no silicide layer;
    forming a conformal cover layer over the semiconductor substrate;
    removing the conformal cover layer over the NMOS gate and the PMOS gate;
    performing a simultaneous silicidation of the NMOS gate and the PMOS gate after the step of forming the source and drain regions containing no silicide layer, the source and drain regions containing no silicide layer being protected by the conformal cover layer from the simultaneous silicidation of the NMOS gate and the PMOS gate;
    removing remaining portions of the conformal cover layer; and
    performing a simultaneous silicidation of all the source and drain regions after the step of removing remaining portions of the conformal cover layer;
    wherein each of the forming the NMOS gate and forming the PMOS gate further comprises:
       forming a first polysilicon layer over the semiconductor substrate;
       forming an oxide layer over the first polysilicon layer;
       removing the oxide layer over the first polysilicon layer of the NMOS gate; and
       forming a second polysilicon layer over the oxide layer.

17. The method according to claim 16 wherein the NMOS gate is undoped.

18. The method according to claim 16 wherein the simultaneous silicidation of the NMOS and PMOS gates forms fully silicided NMOS and PMOS gates.

* * * * *